US008115581B2

(12) United States Patent
Fullerton et al.

(10) Patent No.: US 8,115,581 B2
(45) Date of Patent: Feb. 14, 2012

(54) TECHNIQUES FOR PRODUCING AN ELECTRICAL PULSE

(75) Inventors: Larry W. Fullerton, New Hope, AL (US); Mark D. Roberts, Huntsville, AL (US)

(73) Assignee: Correlated Magnetics Research, LLC, Huntsville, AL (US)

( * ) Notice: Subject to any disclaimer, the term of this patent is extended or adjusted under 35 U.S.C. 154(b) by 31 days.

(21) Appl. No.: 12/322,561

(22) Filed: Feb. 4, 2009

(65) Prior Publication Data
US 2009/0250032 A1 Oct. 8, 2009

Related U.S. Application Data

(63) Continuation-in-part of application No. 12/358,423, filed on Jan. 23, 2009, now Pat. No. 7,868,721, which is a continuation-in-part of application No. 12/123,718, filed on May 20, 2008, now Pat. No. 7,800,471.

(60) Provisional application No. 61/123,019, filed on Apr. 4, 2008.

(51) Int. Cl.
*H01F 7/02* (2006.01)
*G01B 7/14* (2006.01)

(52) U.S. Cl. .................. 335/306; 310/12.22; 310/12.25; 324/207.15

(58) Field of Classification Search ............... 310/70 A, 310/70 R, 153, 166, 168, 171, 12.05, 12.21, 310/12.22, 12.24, 12.25; 335/306; 324/207.15
See application file for complete search history.

(56) References Cited

U.S. PATENT DOCUMENTS

| 381,968 | A | 5/1888 | Tesla |
|---|---|---|---|
| 4,079,558 | A | 3/1978 | Forham |
| 4,416,127 | A | 11/1983 | Naveda |
| 4,547,756 | A | 10/1985 | Miller et al. |
| 4,849,749 | A | 7/1989 | Fukamachi et al. |
| 5,020,625 | A | 6/1991 | Yamauchi et al. |
| 5,383,049 | A | 1/1995 | Carr ........................ 359/283 |
| 5,461,386 | A | 10/1995 | Knebelkamp |
| 5,631,093 | A | 5/1997 | Perry et al. |
| 6,072,251 | A | 6/2000 | Markle ....................... 310/12 |
| 6,118,271 | A | 9/2000 | Ely et al. |
| 6,275,778 | B1 | 8/2001 | Shimada et al. ............ 702/41 |
| 6,457,179 | B1 | 10/2002 | Prendergast |
| 6,607,304 | B1 | 8/2003 | Lake et al. |
| 6,720,698 | B2 | 4/2004 | Galbraith .................... 310/166 |

(Continued)

FOREIGN PATENT DOCUMENTS
EP 0545 737 A1 6/1993
(Continued)

OTHER PUBLICATIONS http://www.schmersalusa.com/safety_controllers/drawings/aes.pdf.

(Continued)

*Primary Examiner* — Ramon Barrera
(74) *Attorney, Agent, or Firm* — Venable LLP; Robert S. Babayi; Leigh D. Thelen

(57) ABSTRACT

Embodiments of the present invention provide an apparatus, comprising a field emission source having polarities and positions in accordance with a code, a plurality of connected coils adapted to move proximate to said field emission source and having positions in accordance with said code, and wherein an electrical pulse is created when said field emission source is aligned with said plurality of connected coils according to said code.

3 Claims, 28 Drawing Sheets

U.S. PATENT DOCUMENTS

| | | | |
|---|---|---|---|
| 6,847,134 B2 | 1/2005 | Frissen et al. | |
| 6,862,748 B2 | 3/2005 | Prendergast | |
| 7,066,778 B2 | 6/2006 | Kretzschmar | |
| 7,362,018 B1 | 4/2008 | Kulogo et al. | 310/68 |
| 7,444,683 B2 | 11/2008 | Prendergast et al. | |
| 2006/0066428 A1 | 3/2006 | McCarthy et al. | |
| 2006/0189259 A1 | 8/2006 | Park et al. | 451/5 |
| 2006/0290451 A1 | 12/2006 | Prendergast et al. | |
| 2008/0186683 A1 | 8/2008 | Ligtenberg et al. | |
| 2008/0272868 A1 | 11/2008 | Prendergast et al. | |

FOREIGN PATENT DOCUMENTS

| | | |
|---|---|---|
| FR | 823395 | 1/1938 |

OTHER PUBLICATIONS http://www.farnell.com/datasheets/36449.pdf.
http://www.schmersalusa.com/catalog_pdfs/BNS_B20.pdf.
http://www.schmersalusa.com/machine_guarding/coded_magnet/drawings/bns333.pdf.
International Search Report and Written Opinion dated Jun. 1, 2009, directed to counterpart application No. PCT/US2009/002027. (11 pages).

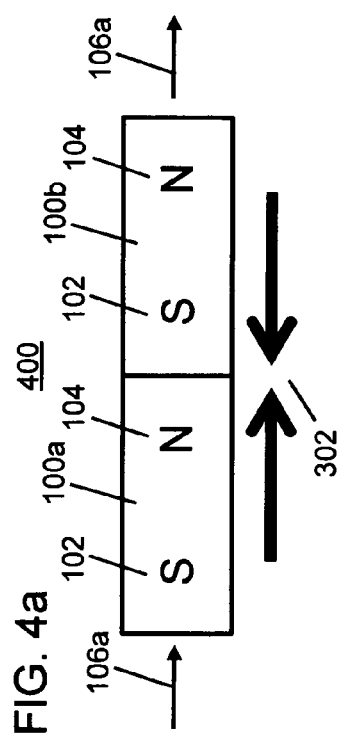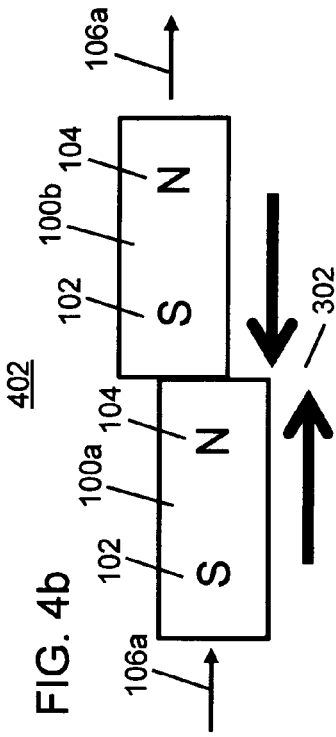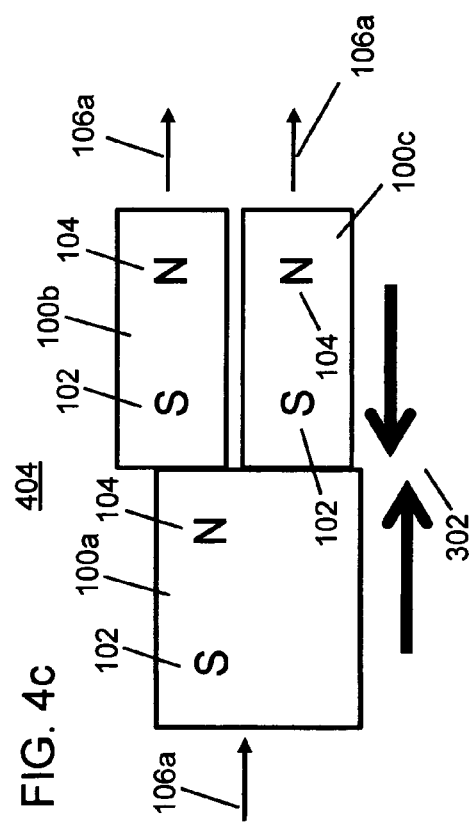

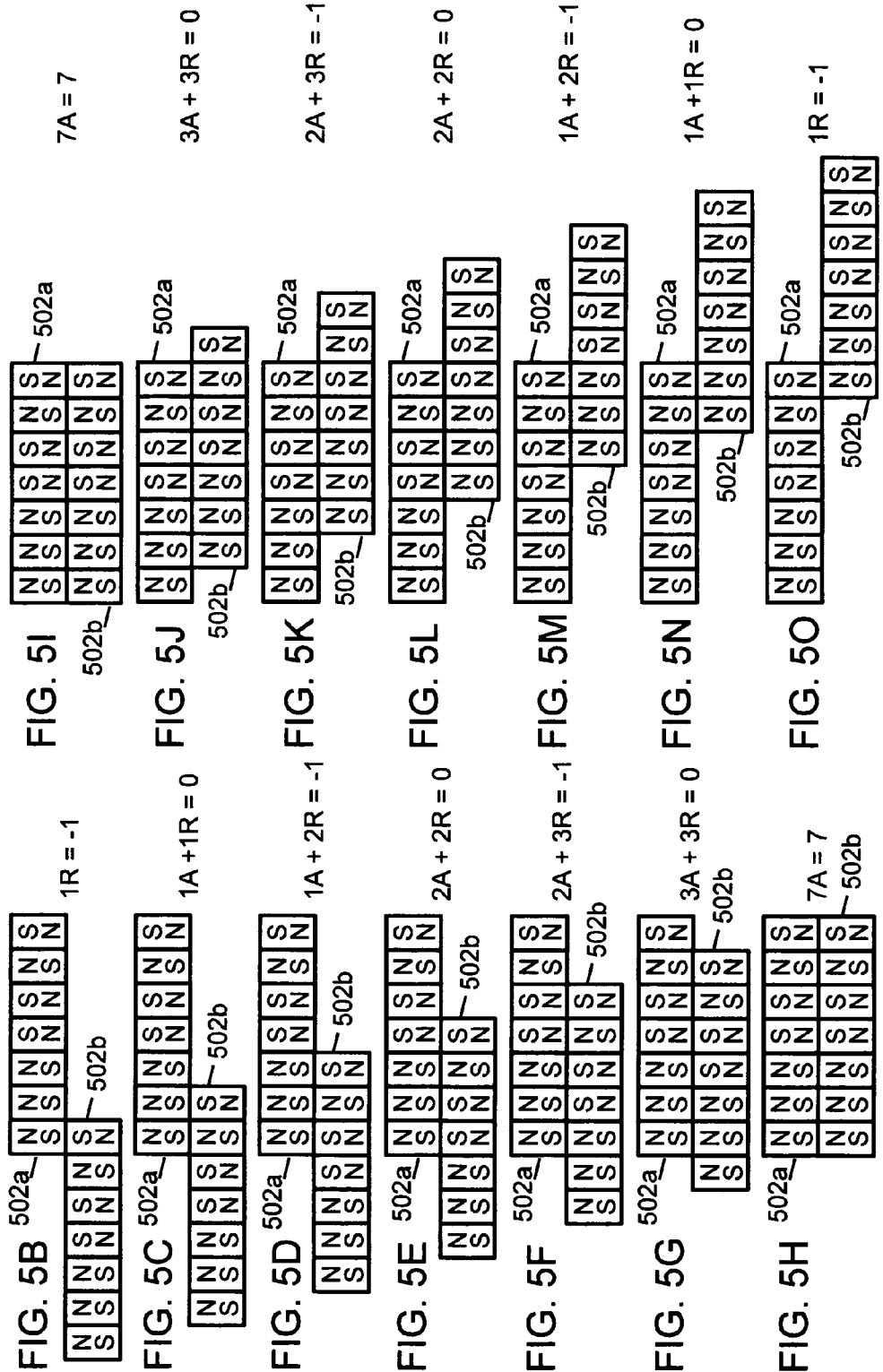

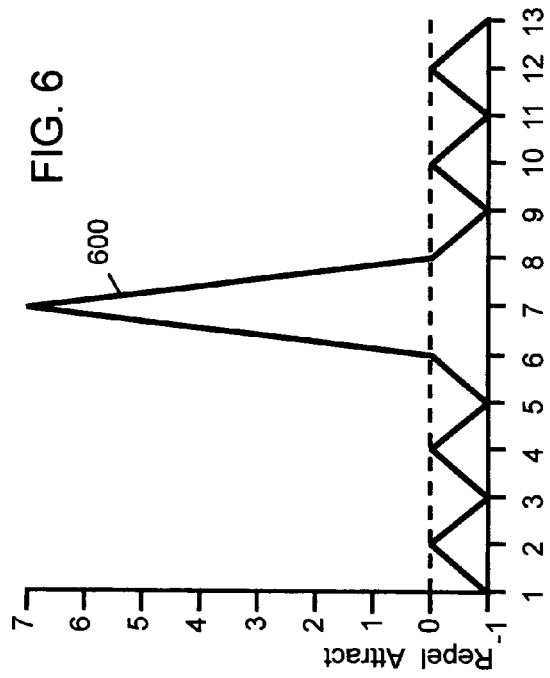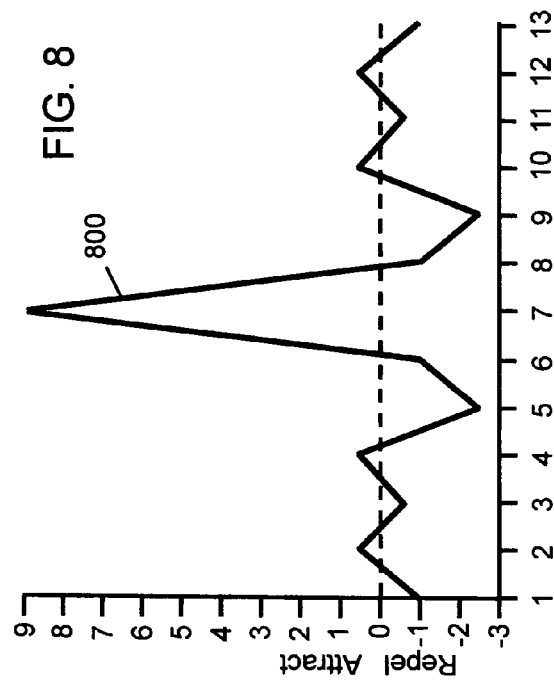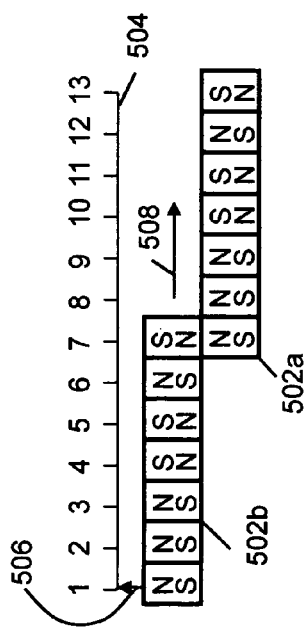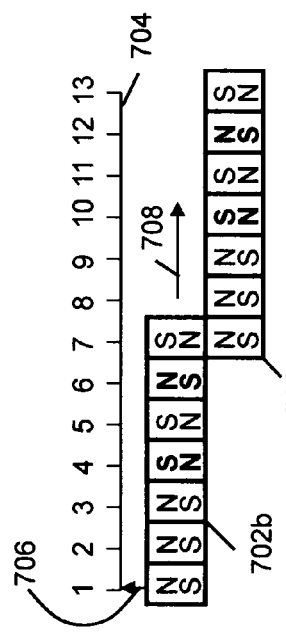

FIG. 7A Barker-7 code = +1 +1 +1 −1 −1 +1 −1
FIG. 7B  1R = −1
FIG. 7C  1.5A + 1R = 0.5
FIG. 7D  1.5A + 2R = −0.5
FIG. 7E  3A + 2.5R = 0.5
FIG. 7F  2A + 4.5R = −2.5
FIG. 7G  3.5A + 4.5R = −1
FIG. 7H  9A = 9
FIG. 7I  9A = 9
FIG. 7J  3.5A + 4.5R = −1
FIG. 7K  2A + 4.5R = −2.5
FIG. 7L  3A + 2.5R = 0.5
FIG. 7M  1.5A + 2R = −0.5
FIG. 7N  1.5A + 1R = 0.5
FIG. 7O  1R = −1

FIG. 9A Barker-7 code = +1 +1 +1 −1 −1 +1 −1

FIG. 11A Barker - 7 code = +1 +1 +1 -1 -1 +1 -1
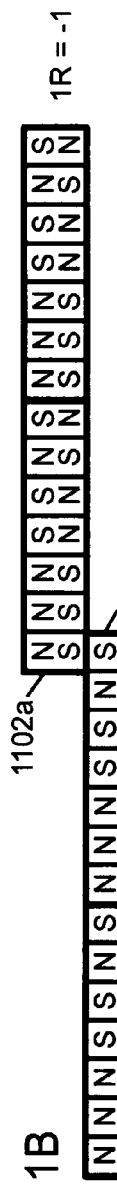
FIG. 11B  1R = -1
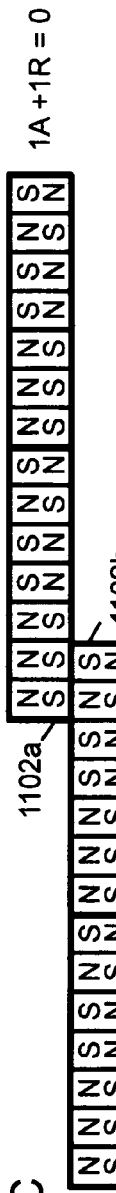
FIG. 11C  1A + 1R = 0
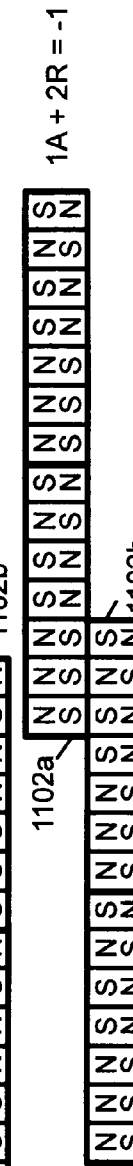
FIG. 11D  1A + 2R = -1
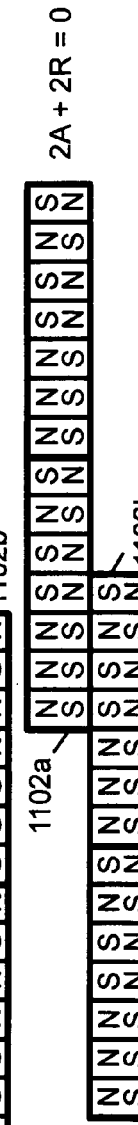
FIG. 11E  2A + 2R = 0
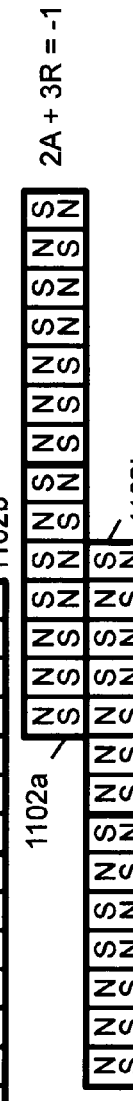
FIG. 11F  2A + 3R = -1
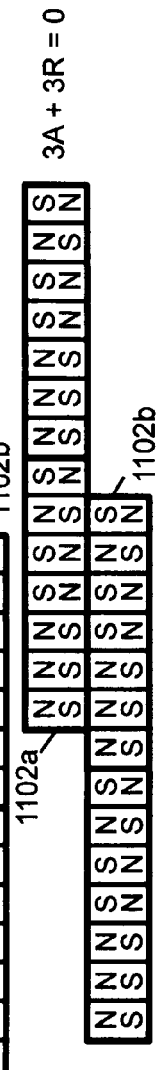
FIG. 11G  3A + 3R = 0
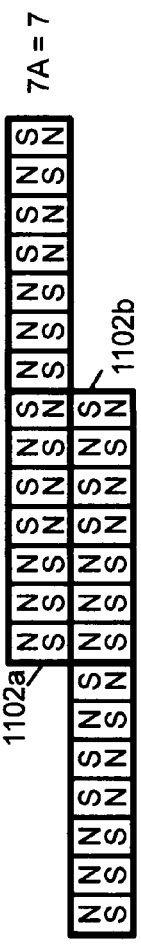
FIG. 11H  7A = 7

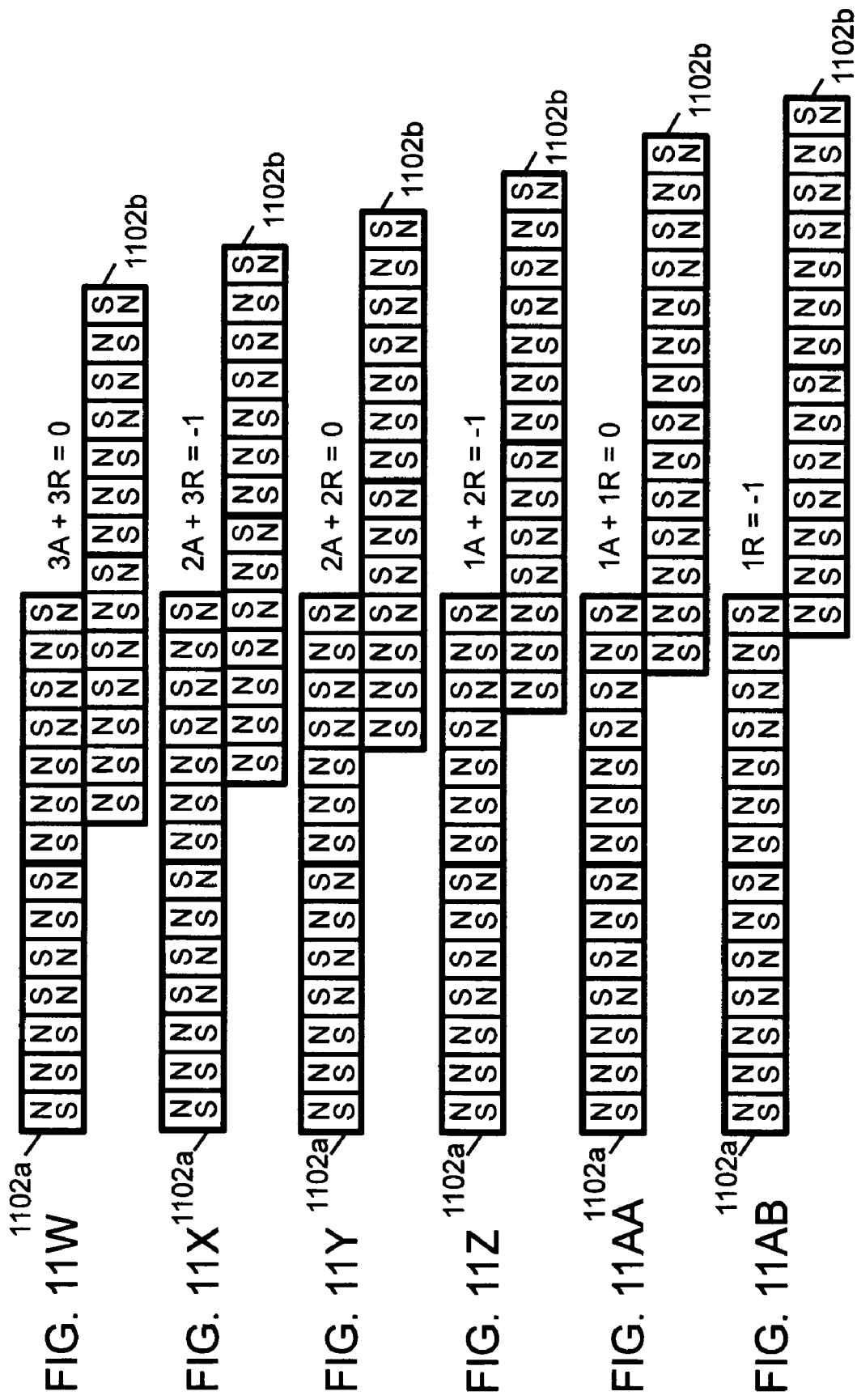

Barker 7x7 wrapped code: 1400

+1 +1 +1 -1 -1 -1 +1 -1
+1 -1 -1 -1 +1 +1 +1
+1 -1 -1 +1 -1 +1 +1
+1 -1 -1 +1 +1 -1 -1
-1 -1 +1 +1 -1 +1 -1
-1 +1 +1 -1 +1 +1 -1
-1 +1 +1 +1 -1 -1 -1

1402a', 1402a — (grid)
1402b — Mirror Image
1402c — Mirror Image Rotated -90°
1402d — Mirror Image Rotated -180°
1402e — Mirror Image Rotated -270°

1404 (arrow)

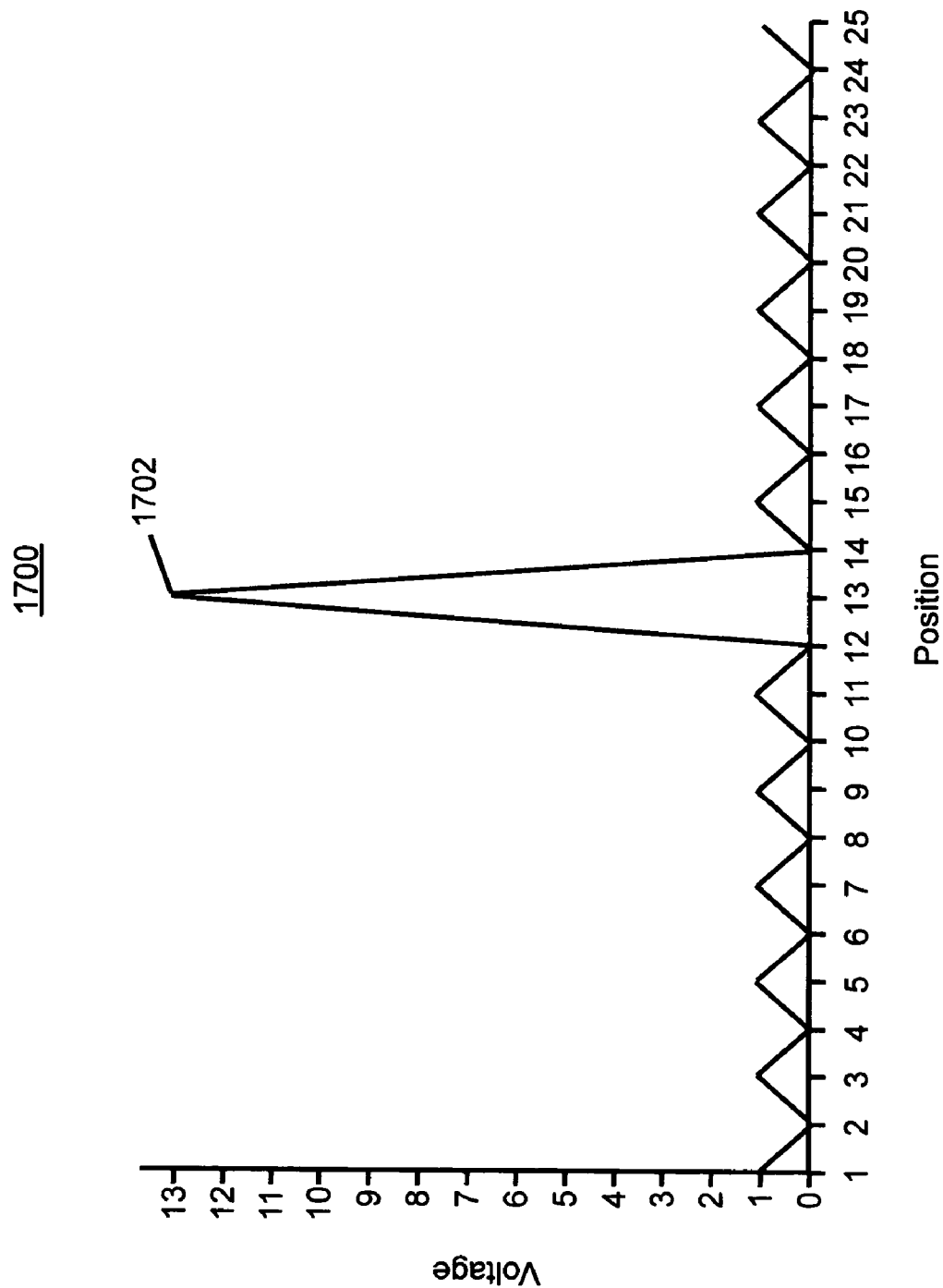

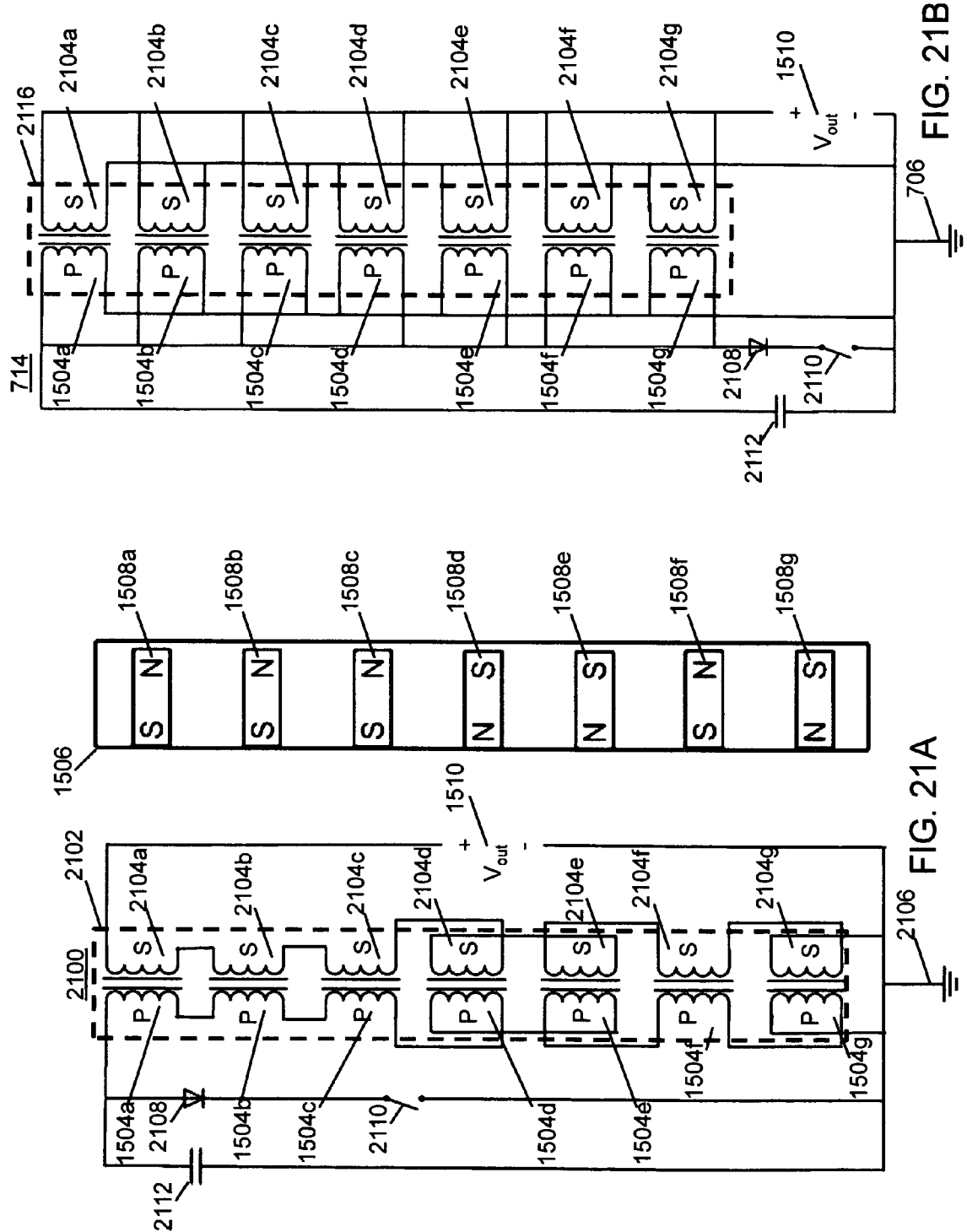

TECHNIQUES FOR PRODUCING AN ELECTRICAL PULSE

CROSS-REFERENCE TO RELATED APPLICATIONS

This Non-provisional application is a continuation-in-part of Non-provisional application Ser. No. 12/358,423, filed Jan. 23, 2009 now U.S. Pat. No. 7,868,721, titled "A Field Emission System and Method", by Fullerton et al., which is a continuation-in-part of Non-provisional application Ser. No. 12/123,718, filed May 20, 2008 now U.S. Pat. No. 7,800,471, titled "A Field Emission System and Method", which claims the benefit of U.S. Provisional Application Ser. No. 61/123,019, filed Apr. 4, 2008, titled "A Field Emission System and Method", which are all incorporated by reference herein in their entirety.

BACKGROUND OF THE INVENTION

The creation of an electric pulse is vital to numerous applications. Several methods are currently available to produce such a pulse and are in need of improvement. For example, but not by way of limitation, a magneto is a device used in the ignition system of gasoline-powered internal combustion engines to provide pulses of high voltage electrical power to the spark plugs.

Although the present invention is not limited to this type, in the type known as a shuttle magneto, an engine rotates a coil of wire between the poles of a magnet. In the inductor magneto, the magnet is rotated and the coil remains stationary.

On each revolution, a cam opens the contact breaker one or more times, interrupting the current, which causes the electromagnetic field in the primary coil to collapse. As the field collapses there is a voltage induced (as described by Faraday's Law) across the primary coil. As the points open, point spacing is such that the voltage across the primary coil will arc across the points. A capacitor is placed across the points to suppress the arc, set the amount of voltage across the primary coil, and to control the rate at which the electrical energy dissipates in the primary coil.

A second coil, with many more turns than the primary, is wound on the same iron core to form an electrical transformer. The ratio of turns in the secondary winding to the number of turns in the primary winding, is called the turns ratio. Voltage across the primary coil results in a proportional voltage being induced across the secondary winding of the coil. The turns ratio between the primary and secondary coil is selected so that the voltage across the secondary reaches a very high value, enough to arc across the gap of the spark plug.

As the above process is inefficient in many respects, there is an ongoing need to improve upon existing techniques to produce an electrical pulse.

SUMMARY OF THE INVENTION

Embodiments of the present invention provide a system for producing an electrical pulse, comprising a first object having a field emission structure comprising a plurality of field emission sources having polarities and positions in accordance with a code; and a second object having a plurality of coils, the plurality of coils being wired and having positions in accordance with the code, the first object moving relative to the second object to align the field emission structure with the plurality of coils, the alignment of the field emission structure with the plurality of coils producing the electrical pulse.

In an embodiment of the present invention the plurality of field emission sources may comprise permanent magnets and the field emission structure and the plurality of coils may be aligned periodically. Further, the code may be a Barker code.

An embodiment of the present invention provides that the second object with the plurality of coils may be embedded in a wheel structure, and an arch-like structure associated with the first object may be formed around the wheel and wherein the wheel may be adapted to turn inside the arch-like structure about an axis.

Further, in an embodiment of the present invention the second object with the plurality of coils may be formed on the outside of a wheel structure, and an arch-like structure associated with the first object may be formed around the wheel structure and wherein the wheel structure may be adapted to turn inside the arch-like structure about an axis.

Yet another embodiment of the present invention provides that the second object with the plurality of coils may be embedded in, or on the outside of, a wheel structure, and a donut shaped structure associated with the first object may completely surround the wheel structure and wherein the wheel structure may be adapted to turn inside the donut shaped structure.

Still another embodiment of the present invention provides that the second object with the plurality of coils may be on the top of a wheel structure, and the first object may be formed on a bottom portion of a partial arch structure positioned above the wheel structure, wherein the wheel may be adapted to turn beneath the partial arch structure.

Yet another embodiment of the present invention provides a method, comprising producing an electrical pulse by passing a field emission structure, comprising a plurality of field emission sources that have polarities and positions in accordance with a code, proximately to a plurality of wired coils having positions in accordance with the code, such that when the field emission structure aligns with the plurality of coils in a manner consistent with the code, the plurality of coils produces the electrical pulse.

Still another embodiment of the present invention provides an apparatus, comprising a field emission source having polarities and positions in accordance with a code; a plurality of connected coils adapted to move proximate to the field emission source and having positions in accordance with the code; and wherein an electrical pulse is created when the field emission source is aligned with the plurality of connected coils according to the code.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 4a depicts two magnets having substantial alignment;

FIG. 4b depicts two magnets having partial alignment;

FIG. 4c depicts different sized magnets having partial alignment;

FIG. 5a depicts a Barker length 7 code used to determine polarities and positions of magnets making up a magnetic field emission structure where all of the magnets have the same field strength;

FIGS. 5b-5o depict exemplary alignments of complementary magnetic field structures;

FIG. 5p provides an alternative method of depicting exemplary alignments of the complementary magnetic field structures of FIGS. 5b-5o;

FIG. 6 depicts the binary autocorrelation function of a Barker length 7 code;

FIG. 7a depicts a Barker length 7 code used to determine polarities and positions of magnets making up a first magnetic field emission structure where two of the magnets have different field strengths;

FIGS. 7b-7o depict exemplary alignments of complementary magnetic field structures;

FIG. 7p provides an alternative method of depicting exemplary alignments of the complementary magnetic field structures of FIGS. 7b-7o;

FIG. 8 depicts an exemplary spatial force function of the two magnetic field emission structures of FIGS. 7b-7o and FIG. 7p;

FIG. 9a depicts exemplary code wrapping of a Barker length 7 code that is used to determine polarities and positions of magnets making up a first magnetic field emission structure;

FIGS. 9b-9o depict exemplary alignments of complementary magnetic field structures;

FIGS. 11b through 11ab depict 27 different alignments of two magnetic field emission structures like that of FIG. 11a;

FIG. 11ac provides an alternative method of depicting exemplary alignments of the complementary magnetic field structures of FIGS. 11b-11ab;

FIG. 14a depicts a two dimensional Barker-like code and a corresponding two-dimensional magnetic field emission structure;

FIG. 17 depicts an exemplary correlation function showing a voltage produced by a coil structure given relative alignments of the coil structure and a magnetic field structure of embodiments of the present invention;

FIG. 21A depicts still another exemplary system for producing an electric pulse in accordance with embodiments of the present invention;

FIG. 21B depicts an alternative exemplary system for producing an electric pulse in accordance with embodiments of the present invention;

DETAILED DESCRIPTION OF THE INVENTION

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in the art. Like numbers refer to like elements throughout.

Figure 1:
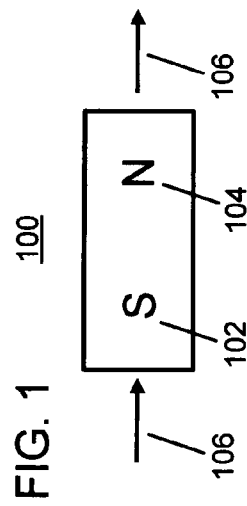
FIG. 1 depicts South and North poles and magnetic field vectors of an exemplary magnet.

FIG. 1 depicts South and North poles and magnetic field vectors of an exemplary magnet. Referring to FIG. 1, a magnet 100 has a South pole 102 and a North pole 104. Also depicted are magnetic field vectors 106 that represent the direction and magnitude of the magnet's moment. North and South poles are also referred to herein as positive (+) and negative (−) poles, respectively. In accordance with the invention, magnets can be permanent magnets, impermanent magnets, electromagnets, electro-permanent magnets, involve hard or soft material, and can be superconductive. In some applications, magnets can be replaced by electrets. Magnets can be most any size from very large to very small to include nanometer scale. In the case of non-superconducting materials there is a smallest size limit of one domain. When a material is made superconductive, however, the magnetic field that is within it can be as complex as desired and there is no practical lower size limit until you get to atomic scale. Magnets may also be created at atomic scale as electric and magnetic fields produced by molecular size structures may be tailored to have correlated properties, e.g. nanomaterials and macromolecules.

At the nanometer scale, one or more single domains can be used for coding where each single domain has a code and the quantization of the magnetic field would be the domain.

Figure 2:
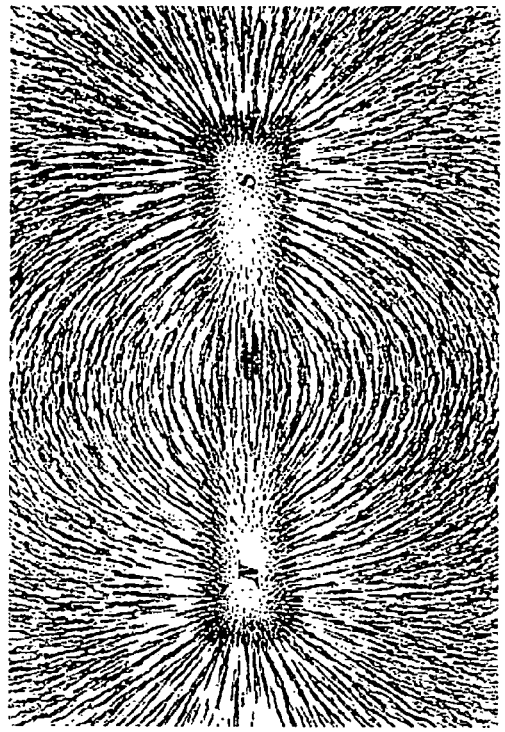
FIG. 2 depicts iron filings oriented in the magnetic field produced by a bar magnet.

FIG. 2 depicts iron filings oriented in the magnetic field 200 (i.e., field domain) produced by a single bar magnet.

Figure 3A:
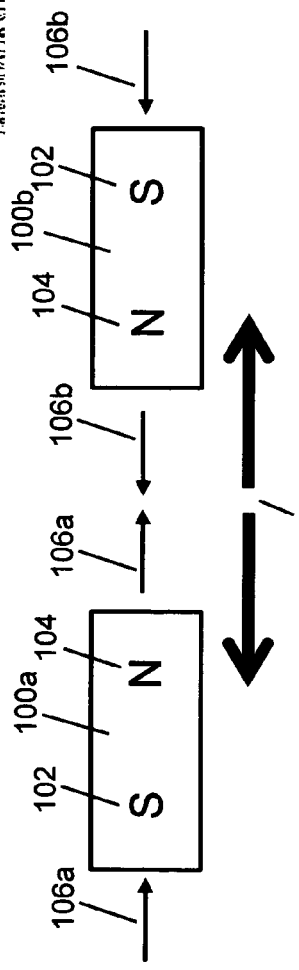
FIG. 3a depicts two magnets aligned such that their polarities are opposite in direction resulting in a repelling spatial force.

FIG. 3*a* depicts two magnets aligned such that their polarities are opposite in direction resulting in a repelling spatial force. Referring to FIG. 3*a*, two magnets 100*a* and 100*b* are aligned such that their polarities are opposite in direction. Specifically, a first magnet 100*a* has a South pole 102 on the left and a North pole 104 on the right, whereas a second magnet 100*b* has a North pole 104 on the left and a South pole 102 on the right such that when aligned the magnetic field vectors 106*a* of the first magnet 100*a* are directed against the magnetic field vectors 106*b* of the second magnet 100*b* resulting in a repelling spatial force 300 that causes the two magnets to repel each other.

Figure 3B:
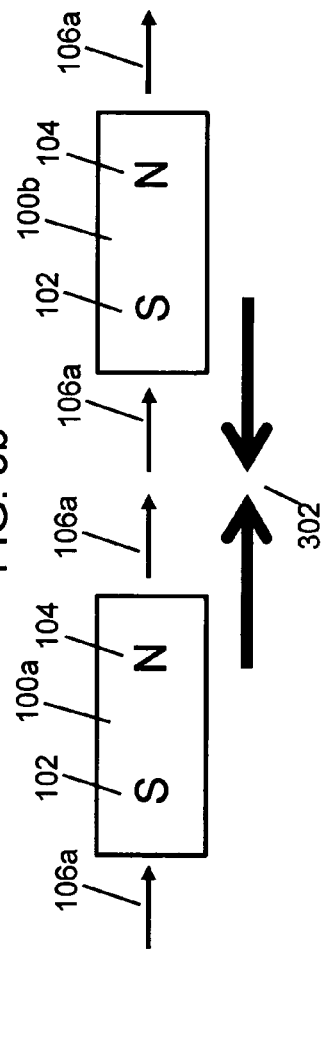
FIG. 3b depicts two magnets aligned such that their polarities are the same in direction resulting in an attracting spatial force.

FIG. 3*b* depicts two magnets aligned such that their polarities are the same in direction resulting in an attracting spatial force. Referring to FIG. 3*b*, two magnets 100*a* and 100*b* are aligned such that their polarities are in the same direction. Specifically, a first magnet 100*a* has a South pole 102 on the left and a North pole 104 on the right, and a second magnet 100*b* also has South pole 102 on the left and a North pole 104 on the right such that when aligned the magnetic field vectors 106*a* of the first magnet 100*a* are directed the same as the magnetic field vectors 106*a* of the second magnet 100*b* resulting in an attracting spatial force 302 that causes the two magnets to attract each other.

FIG. 4*a* depicts two magnets 100*a*, 100*b* having substantial alignment 400 such that the North pole 104 of the first magnet 100*a* has substantially full contact across its surface with the surface of the South pole 102 of the second magnet 10*b*.

FIG. 4*b* depicts two magnets 100*a*, 100*b* having partial alignment 402 such that the North pole 104 of the first magnet 100*a* is in contact across its surface with approximately two-thirds of the surface of the South pole 102 of the second magnet 100*b*.

FIG. 4*c* depicts a first sized magnet 100*a* and smaller different sized magnets 100*b* 100*c* having partial alignment 404. As seen in FIG. 4*c*, the two smaller magnets 100*b* and 100*c* are aligned differently with the larger magnet 100*a*.

Generally, one skilled in the art will recognize in relation to FIGS. 4*a* through 4*c* that the direction of the vectors 106*a* of the attracting magnets will cause them to align in the same direction as the vectors 106*a*. However, the magnets can be moved relative to each other such that they have partial alignment yet they will still 'stick' to each other and maintain their positions relative to each other.

In accordance with the present invention, combinations of magnet (or electric) field emission sources, referred to herein as magnetic field emission structures, can be created in accordance with codes having desirable correlation properties. When a magnetic field emission structure is brought into alignment with a complementary, or mirror image, magnetic field emission structure the various magnetic field emission sources all align causing a peak spatial attraction force to be produced whereby misalignment of the magnetic field emission structures causes the various magnetic field emission sources to substantially cancel each other out as function of the code used to design the structures. Similarly, when a magnetic field emission structure is brought into alignment with a duplicate magnetic field emission structure the various magnetic field emission sources all align causing a peak spatial repelling force to be produced whereby misalignment of the magnetic field emission structures causes the various magnetic field emission sources to substantially cancel each other out. As such, spatial forces are produced in accordance with the relative alignment of the field emission structures and a spatial force function. As described herein, these spatial force functions can be used to achieve precision alignment and precision positioning. Moreover, these spatial force functions enable the precise control of magnetic fields and associated spatial forces thereby enabling new forms of attachment devices for attaching objects with precise alignment and new systems and methods for controlling precision movement of objects. Generally, a spatial force has a magnitude that is a function of the relative alignment of two magnetic field emission structures and their corresponding spatial force (or correlation) function, the spacing (or distance) between the two magnetic field emission structures, and the magnetic field strengths and polarities of the sources making up the two magnetic field emission structures.

The characteristic of the present invention whereby the various magnetic field sources making up two magnetic field emission structures can effectively cancel out each other when they are brought out of alignment can be described as a release force (or a release mechanism). This release force or release mechanism is a direct result of the correlation coding used to produce the magnetic field emission structures and, depending on the code employed, can be present regardless of whether the alignment of the magnetic field emission structures corresponds to a repelling force or an attraction force.

One skilled in the art of coding theory will recognize that there are many different types of codes having different correlation properties that have been used in communications for channelization purposes, energy spreading, modulation, and other purposes. Many of the basic characteristics of such codes make them applicable for use in producing the magnetic field emission structures described herein. For example, Barker codes are known for their autocorrelation properties. Although, Barker codes are used herein for exemplary purposes, other forms of codes well known in the art because of their autocorrelation, cross-correlation, or other properties are also applicable to the present invention including, for example, Gold codes, Kasami sequences, hyperbolic congruential codes, quadratic congruential codes, linear congruential codes, Welch-Costas array codes, Golomb-Costas array codes, pseudorandom codes, chaotic codes, and Optimal Golomb Ruler codes. Generally, any code can be employed.

The correlation principles of the present invention may or may not require overcoming normal 'magnet orientation' behavior using a holding mechanism. For example, magnets of the same magnetic field emission structure can be sparsely separated from other magnets (e.g., in a sparse array) such that the magnetic forces of the individual magnets do not substantially interact, in which case the polarity of individual magnets can be varied in accordance with a code without requiring a substantial holding force to prevent magnetic forces from 'flipping' a magnet. Magnets that are close enough such that their magnetic forces substantially interact such that their magnetic forces would normally cause one of them to 'flip' so that their moment vectors align can be made to remain in a desired orientation by use of a holding mechanism such as an adhesive, a screw, a bolt & nut, etc.

FIG. 5a depicts a Barker length 7 code used to determine polarities and positions of magnets making up a magnetic field emission structure. Referring to FIG. 5a, a Barker length 7 code 500 is used to determine the polarities and the positions of magnets making up a magnetic field emission structure 502. Each magnet has the same or substantially the same magnetic field strength (or amplitude), which for the sake of this example is provided a unit of 1 (where A=Attract, R=Repel, A=−R, A=1, R=−1).

FIGS. 5b through 5o depict different alignments of two complementary magnetic field structures like that of FIG. 5a. Referring to FIGS. 5b through 5o, a first magnetic field structure 502a is held stationary. A second magnetic field emission structure 502b that is identical to the first magnetic field emission structure 502a is shown sliding from left to right in 13 different alignments relative to the first magnetic field emission structure 502a in FIGS. 5b through 5o. The boundary where individual magnets of the two structures interact is referred to herein as an interface boundary. (Note that although the first magnetic field emission structure 502a is identical to the second magnetic field structure in terms of magnet field directions, the interfacing poles are of opposite or complementary polarity).

The total magnetic force between the first and second magnetic field emission structures 502a 502b is determined as the sum from left to right along the structure of the individual forces, at each magnet position, of each magnet or magnet pair interacting with its directly opposite corresponding magnet in the opposite magnetic field emission structure. Where only one magnet exists, the corresponding magnet is 0, and the force is 0. Where two magnets exist, the force is R for equal poles or A for opposite poles. Thus, for FIG. 5b, the first six positions to the left have no interaction. The one position in the center shows two "S" poles in contact for a repelling force of 1. The next six positions to the right have no interaction, for a total force of 1R=−1, a repelling force of magnitude 1. The spatial correlation of the magnets for the various alignments is similar to radio frequency (RF) signal correlation in time, since the force is the sum of the products of the magnet strengths of the opposing magnet pairs over the lateral width of the structure. Thus, $$f = \sum_{n=1,N} p_n q_n$$

where,
f is the total magnetic force between the two structures,
n is the position along the structure up to maximum position N, and
$p_n$ are the strengths and polarities of the lower magnets at each position n.
$q_n$ are the strengths and polarities of the upper magnets at each position n.

An alternative equation separates strength and polarity variables, as follows:

$$f = \sum_{n=1,N} l_n p_n u_n q_n$$

where,
f is the total magnetic force between the two structures,
n is the position along the structure up to maximum position N,
$l_n$ are the strengths of the lower magnets at each position n,
$p_n$ are the polarities (1 or −1) of the lower magnets at each position n,
$u_n$ are the strengths of the upper magnets at each position n, and
$q_n$ are the polarities (1 or −1) of the upper magnets at each position n, The above force calculations can be performed for each shift of the two structures to plot a force vs. position function for the two structures. A force vs. position function may alternatively be called a spatial force function. In other words, for each relative alignment, the number of magnet pairs that repel plus the number of magnet pairs that attract is calculated, where each alignment has a spatial force in accordance with a spatial force function based upon the correlation function and magnetic field strengths of the magnets. With the specific Barker code used, it can be observed from the figures that the spatial force varies from −1 to 7, where the peak occurs when the two magnetic field emission structures are aligned such that their respective codes are aligned as shown in FIG. 5h and FIG. 5i. (FIG. 5h and FIG. 5i show the same alignment, which is repeated for continuity between the two columns of figures). The off peak spatial force, referred to as a side lobe force, varies from 0 to −1. As such, the spatial force function causes the magnetic field emission structures to generally repel each other unless they are aligned such that each of their magnets is correlated with a complementary magnet (i.e., a magnet's South pole aligns with another magnet's North pole, or vice versa). In other words, the two magnetic field emission structures substantially correlate when they are aligned such that they substantially mirror each other.

FIG. 5p depicts the sliding action shown in FIGS. 5b through 5o in a single diagram. In FIG. 5p, a first magnet structure 502a is stationary while a second magnet structure 502b is moved across the top of the first magnet structure 502a in one direction 508 according to a scale 504. The second magnet structure 502b is shown at position 1 according to an indicating pointer 506, which moves with the left magnet of the second structure 502b. As the second magnet structure 502b is moved from left to right, the total attraction and repelling forces are determined and plotted in the graph of FIG. 6.

FIG. 6 depicts the binary autocorrelation function 600 of the Barker length 7 code, where the values at each alignment position 1 through 13 correspond to the spatial force values calculated for the thirteen alignment positions shown in FIGS. 5b through 5o (and in FIG. 5p). As such, since the magnets making up the magnetic field emission structures 502a, 502b have the same magnetic field strengths, FIG. 6 also depicts the spatial force function of the two magnetic field emission structures of FIGS. 5b-5o and 5p. As the true autocorrelation function for correlated magnet field structures is repulsive, and most of the uses envisioned will have attractive correlation peaks, the usage of the term 'autocorrelation' herein will refer to complementary correlation unless otherwise stated. That is, the interacting faces of two such correlated magnetic field emission structures will be complementary to (i.e., mirror images of) each other. This complementary autocorrelation relationship can be seen in FIG. 5b where the bottom face of the first magnetic field emission structure 502b having the pattern 'S S S N N S N' is shown interacting with the top face of the second magnetic field emission structure 502a having the pattern 'N N N S S N S', which is the mirror image (pattern) of the bottom face of the first magnetic field emission structure 502b.

The attraction functions of FIG. 6 and others in this disclosure are idealized, but illustrate the main principle and primary performance. The curves show the performance assuming equal magnet size, shape, and strength and equal distance between corresponding magnets. For simplicity, the plots only show discrete integer positions and interpolate linearly. Actual force values may vary from the graph due to various factors such as diagonal coupling of adjacent magnets, magnet shape, spacing between magnets, properties of magnetic materials, etc. The curves also assume equal attract and repel forces for equal distances. Such forces may vary considerably and may not be equal depending on magnet material and field strengths. High coercive force materials typically perform well in this regard.

FIG. 7a depicts a Barker length 7 code 500 used to determine polarities and positions of magnets making up a magnetic field emission structure 702. Each magnet has the same or substantially the same magnetic field strength (or amplitude), which for the sake of this example is provided a unit of 1 (A=−R, A=1, R=−1), with the exception of two magnets indicated with bolded N and S that have twice the magnetic strength as the other magnets. As such, a bolded magnet and non-bolded magnet represent 1.5 times the strength as two non-bolded magnets and two bolded magnets represent twice the strength of two non-bolded magnets.

FIGS. 7b through 7o depict different alignments of two complementary magnetic field structures like that of FIG. 7a. Referring to FIGS. 7b through 7o, a first magnetic field structure 702a is held stationary. A second magnetic field emission structure 702b that is identical to the first magnetic field emission structure 702a is shown in 13 different alignments relative to the first magnetic field emission structure 702a in FIGS. 7b through 7o. For each relative alignment, the number of magnet pairs that repel plus the number of magnet pairs that attract is calculated, where each alignment has a spatial force in accordance with a spatial force function based upon the correlation function and the magnetic field strengths of the magnets. With the specific Barker code used, the spatial force varies from −2.5 to 9, where the peak occurs when the two magnetic field emission structures are aligned such that their respective codes are aligned. The off peak spatial force, referred to as the side lobe force, varies from 0.5 to −2.5. As such, the spatial force function causes the structures to have minor repel and attract forces until about two-thirds aligned when there is a fairly strong repel force that weakens just before they are aligned. When the structures are substantially aligned their codes align and they strongly attract as if the magnets in the structures were not coded.

FIG. 7p depicts the sliding action shown in FIGS. 7b through 7o in a single diagram. In FIG. 7p, a first magnet structure 702a is stationary while a second magnet structure 702b is moved across the top of the first magnet structure 702a in a direction 708 according to a scale 704. The second magnet structure 702b is shown at position 1 according to an indicating pointer 706, which moves with the left magnet of the second structure 702b. As the second magnet structure 702b is moved from left to right, the total attraction and repelling forces are determined and plotted in the graph of FIG. 8.

FIG. 8 depicts an exemplary spatial force function 800 of the two magnetic field emission structures of FIGS. 7b through 7o (and FIG. 7p).

The examples provided thus far have used the Barker 7 code to illustrate the principles of the invention. Barker codes have been found to exist in lengths up to 13. Table 1 shows Barker codes up to length 13. Additional Barker codes may be generated by cyclic shifts (register rotations) or negative polarity (multiply by −1) transformations of the codes of Table 1. The technical literature includes Barker-like codes of even greater length. Barker codes offer a peak force equal to the length and a maximum misaligned force of 1 or −1. Thus, the ratio of peak to maximum misaligned force is length/1 or −length/1.

TABLE 1

Barker Codes

| Length | Codes | |
|---|---|---|
| 2 | +1 −1 | +1 +1 |
| 3 | +1 +1 −1 | |
| 4 | +1 −1 +1 +1 | +1 −1 −1 −1 |
| 5 | +1 +1 +1 −1 +1 | |
| 7 | +1 +1 +1 −1 −1 +1 −1 | |
| 11 | +1 +1 +1 −1 −1 −1 +1 −1 −1 +1 −1 | |
| 13 | +1 +1 +1 +1 +1 −1 −1 +1 +1 −1 +1 −1 +1 | |

Numerous other codes are known in the literature for low autocorrelation when misaligned and may be used for magnet structure definition as illustrated with the Barker 7 code. Such codes include, but are not limited to maximal length PN sequences, Kasami codes, Golomb ruler codes and others. Codes with low non-aligned autocorrelation offer the precision lock at the alignment point as shown in FIG. 6.

Pseudo Noise (PN) and noise sequences also offer codes with low non-aligned autocorrelation. Most generally a noise sequence or pseudo-noise sequence is a sequence of 1 and −1 values that is generated by a true random process, such as a noise diode or other natural source, or is numerically generated in a deterministic (non random) process that has statistical properties much like natural random processes. Thus, many true random and pseudo random processes may generate suitable codes for use with the present invention. Random processes however will likely have random variations in the sidelobe amplitude, i.e., non-aligned force as a function of distance from alignment; whereas, Barker codes and others may have a constant amplitude when used as cyclic codes (FIG. 9a). One such family is maximal length PN codes generated by linear feedback shift registers (LFSR). LFSR codes offer a family of very long codes with a constant low level non-aligned cyclic autocorrelation. The codes come in lengths of powers of two minus one and several different codes of the same length are generally available for the longer lengths. LFSR codes offer codes in much longer lengths than are available with Barker codes. Table 2 summarizes the properties for a few of the shorter lengths. Extensive data on LFSR codes is available in the literature.

TABLE 2

LFSR Sequences

| Number of Stages | Length of sequences | Number of Sequences | Example feedback |
|---|---|---|---|
| 2 | 3 | 1 | 1, 2 |
| 3 | 7 | 2 | 2, 3 |

TABLE 2-continued

LFSR Sequences

| Number of Stages | Length of sequences | Number of Sequences | Example feedback |
|---|---|---|---|
| 4 | 15 | 2 | 3, 4 |
| 5 | 31 | 6 | 3, 5 |
| 6 | 63 | 6 | 5, 6 |
| 7 | 127 | 18 | 6, 7 |
| 8 | 255 | 16 | 4, 5, 6, 8 |
| 9 | 511 | 48 | 5, 9 |
| 10 | 1023 | 60 | 7, 10 |

The literature for LFSR sequences and related sequences such as Gold and Kasami often uses a 0, 1 notation and related mathematics. The two states 0, 1 may be mapped to the two states −1, +1 for use with magnet polarities. An exemplary LFSR sequence for a length 4 shift register starting at 1,1,1,1 results in the feedback sequence: 000100110101111, which may be mapped to: −1, −1, −1, +1, −1, −1, +1, +1, −1, +1, −1, +1, +1, +1, +1. Alternatively, the opposite polarities may be used or a cyclic shift may be used.

Code families also exist that offer a set of codes that may act as a unique identifier or key, requiring a matching part to operate the device. Kasami codes and other codes can achieve keyed operation by offering a set of codes with low cross correlation in addition to low autocorrelation. Low cross correlation for any non-aligned offset means that one code of the set will not match and thus not lock with a structure built according to the another code in the set. For example, two structures A and A*, based on code A and the complementary code A*, will slide and lock at the precision lock point. Two structures B and B* from the set of low cross correlation codes will also slide and lock together at the precision alignment point. However, code A will slide with low attraction at any point but will not lock with code B* because of the low cross correlation properties of the code. Thus, the code can act like a key that will only achieve lock when matched with a like (complementary) pattern.

Kasami sequences are binary sequences of length $2^N$ where N is an even integer. Kasami sequences have low cross-correlation values approaching the Welch lower bound for all time shifts and may be used as cyclic codes. There are two classes of Kasami sequences—the small set and the large set.

The process of generating a Kasami sequence starts by generating a maximum length sequence $a_n$, where n=1 . . . $2^N-1$. Maximum length sequences are cyclic sequences so $a_n$ is repeated periodically for n larger than $2^N-1$. Next, we generate another sequence $b_n$ by generating a decimated sequence of $a_n$ at a period of $q=2^{N/2}+1$, i.e., by taking every $q^{th}$ bit of $a_n$. We generate $b_n$ by repeating the decimated sequence q times to form a sequence of length $2^N-1$. We then cyclically shift $b_n$ and add to $a_n$ for the remaining $2^N-2$ non repeatable shifts. The Kasami set of codes comprises $a_n$, $a_n+b_n$, and the cyclically shifted $a_n+(\text{shift } b_n)$ sequences. This set has $2^{N/2}$ different sequences. A first coded structure may be based on any one of the different sequences and a complementary structure may be the equal polarity or negative polarity of the first coded structure, depending on whether repelling or attracting force is desired. Neither the first coded structure nor the complementary structure will find strong attraction with any of the other codes in the $2^{N/2}$ different sequences. An exemplary 15 length Kasami small set of four sequences is given in Table 3 below. The 0, 1 notation may be transformed to −1, +1 as described above. Cyclic shifts and opposite polarity codes may be used as well.

TABLE 3

Exemplary Kasami small set sequences.

| | Sequence | | | | | | | | | | | | | | |
|---|---|---|---|---|---|---|---|---|---|---|---|---|---|---|---|
| K1 | 0 | 0 | 0 | 1 | 0 | 0 | 1 | 1 | 0 | 1 | 0 | 1 | 1 | 1 | 1 |
| K2 | 0 | 1 | 1 | 1 | 1 | 1 | 1 | 0 | 1 | 1 | 1 | 0 | 1 | 0 | 0 |
| K3 | 1 | 1 | 0 | 0 | 1 | 0 | 0 | 0 | 0 | 1 | 1 | 0 | 0 | 1 |
| K4 | 1 | 0 | 1 | 0 | 0 | 1 | 0 | 1 | 1 | 0 | 0 | 0 | 0 | 0 |

Other codes, such as Walsh codes and Hadamard codes, offer sets of codes with perfectly zero cross correlation across the set of codes when aligned, but possibly high correlation performance when misaligned. Such codes can provide the unique key function when combined with mechanical constraints that insure alignment. Exemplary Walsh codes are as follows:

Denote W(k, n) as Walsh code k in n-length Walsh matrix. It means the k-th row of Hadamard matrix H(m), where n=2m, m an integer. Here k could be 0, 1, . . . , n−1. A few Walsh codes are shown in Table 4.

TABLE 4

Walsh Codes

| Walsh Code | Code |
|---|---|
| W(0,1) | 1 |
| W(0,2) | 1, 1 |
| W(1,2) | 1, −1 |
| W(0,4) | 1, 1, 1, 1 |
| W(1,4) | 1, −1, 1, −1 |
| W(2,4) | 1, 1, −1, −1 |
| W(3,4) | 1, −1, −1, 1 |
| W(0,8) | 1, 1, 1, 1, 1, 1, 1, 1 |
| W(1,8) | 1, −1, 1, −1, 1, −1, 1, −1 |
| W(2,8) | 1, 1, −1, −1, 1, 1, −1, −1 |
| W(3,8) | 1, −1, −1, 1, 1, −1, −1, 1 |
| W(4,8) | 1, 1, 1, 1, −1, −1, −1, −1 |
| W(5,8) | 1, −1, 1, −1, −1, 1, −1, 1 |
| W(6,8) | 1, 1, −1, −1, −1, −1, 1, 1 |
| W(7,8) | 1, −1, −1, 1, −1, 1, 1, −1 |

In use, Walsh codes of the same length would be used as a set of codes that have zero interaction with one another, i.e., Walsh code W(0,8) will not attract or repel any of the other codes of length 8 when aligned. Alignment should be assured by mechanical constraints because off alignment attraction can be great.

Codes may be employed as cyclic codes or non-cyclic codes. Cyclic codes are codes that may repetitively follow another code, typically immediately following with the next step after the end of the last code. Such codes may also be referred to as wrapping or wraparound codes. Non-cyclic codes are typically used singly or possibly used repetitively but in isolation from adjacent codes. The Barker 7 code example of FIG. 5a is a non-cyclic use of the code; whereas the example of FIG. 9a is a cyclic use of the same code.

FIG. 9a depicts an exemplary cyclic code comprising three modulos of a Barker length 7 code. Referring to FIG. 9a, a Barker length 7 code 500 is repeated three times to produce a magnetic field emission structure 902.

FIGS. 9b through 9o depict relative alignments of a first magnetic field emission structure 502 having polarities and magnet positions defined by a Barker length 7 code 500 and a second magnetic field emission structure 902 that corresponds to three repeating code modulos of the code 500 used to define the first magnetic field emission structure 500. Each magnet has the same or substantially the same magnetic field strength (or amplitude), which for the sake of this example will be provided a unit of 1 (A=−R, A=1, R=−1). Shown in FIGS. 9a through 9o are 13 different alignments of the first magnetic field emission structure 502 to the second magnetic field emission structure 902 where all the magnets of the first magnetic structure 502 are always in contact with the repeating second magnetic field emission structure 902. For each relative alignment, the number of magnet pairs that repel plus the number of magnet pairs that attract is calculated, where each alignment has a spatial force in accordance with a spatial force function based upon the correlation function and the magnetic field strengths of the magnets. With the specific Barker code used, the spatial force varies from −1 to 7, where the peak occurs when the two magnetic field emission structures are aligned such that their respective codes are aligned. The off peak spatial force, referred to as side lobe force, is −1. As such, the spatial force function causes the structures to generally repel each other unless they are substantially aligned when they will attract as if the magnets in the structures were not coded.

Figure 9P:
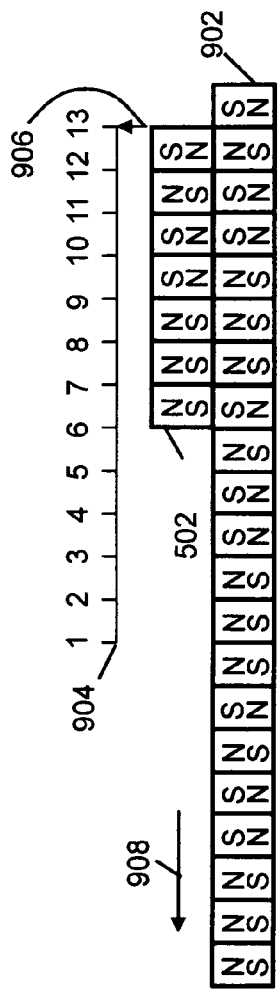
FIG. 9p provides an alternative method of depicting exemplary alignments of the complementary magnetic field structures of FIGS. 9b-9o.

FIG. 9p depicts the sliding action shown in FIGS. 9b through 9o in a single diagram. In FIG. 9p, a first magnet structure 902 is stationary while a second magnet structure 502 is moved across the top of the first magnet structure 902 in a direction 908 according to a scale 904. The second magnet structure 502 is shown at a position 13 according to an indicating pointer 906, which moves with the right magnet of the second structure 502. As the second magnet structure 502 is moved from right to left, the total attraction and repelling forces are determined and plotted in the graph of FIG. 10.

Figure 10:
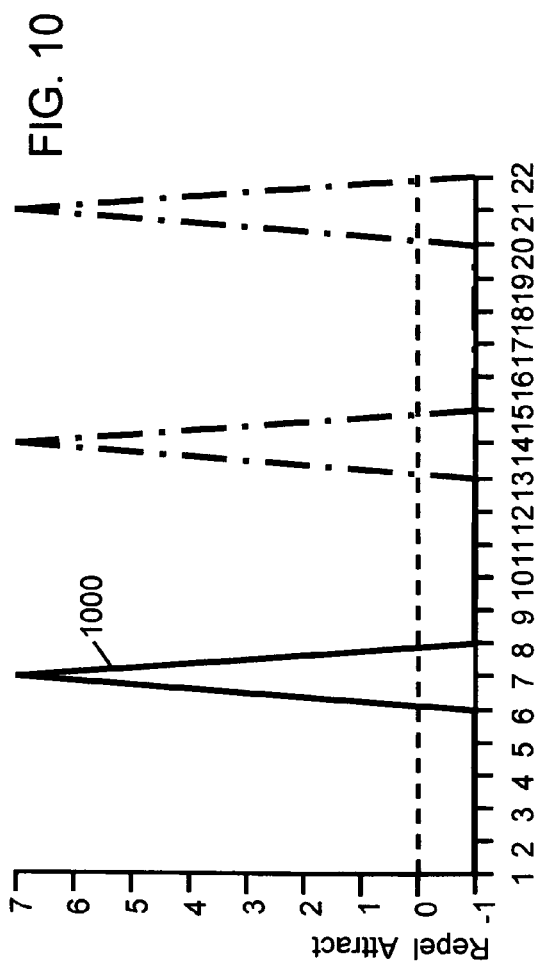
FIG. 10 depicts an exemplary spatial force function of the two magnetic field emission structures of FIGS. 9b-9o and FIG. 9p.

FIG. 10 depicts an exemplary spatial force function 1000 of the two magnetic field emission structures of FIGS. 9b through 9o (and FIG. 9p) where the code that defines the second magnetic field emission structure 902 repeats. As such, as the code modulo repeats there is a peak spatial force that repeats every seven alignment shifts. The dash-dot lines of FIG. 10 depict additional peak spatial forces that occur when the first magnetic field structure 502 is moved relative to additional code modulos, for example, two additional code modulos. Note that the total force shows a peak of 7 each time the sliding magnet structure 502 aligns with the underlying Barker 7 pattern in a similar manner as previously described for FIG. 6 except the misaligned positions (positions 1-6 for example) show a constant −1 indicating a repelling force of one magnet pair. In contrast, the force in FIG. 6 alternates between 0 and −1 in the misaligned region, where the alternating values are the result of their being relative positions of non-cyclic structures where magnets do not have a corresponding magnet with which to pair up. In magnet structures, cyclic codes may be placed in repeating patterns to form longer patterns or may cycle back to the beginning of the code as in a circle or racetrack pattern. As such, cyclic codes are useful on cylindrically or spherically shaped objects.

Figure 11I:
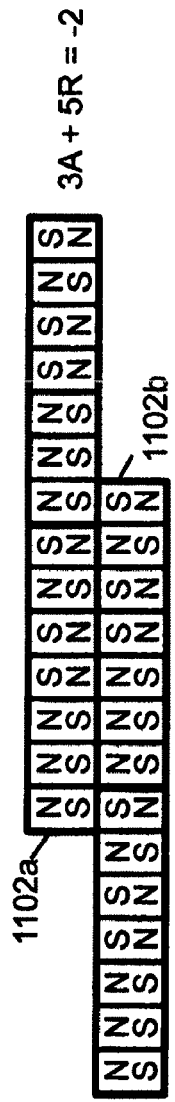
Figure 11J:
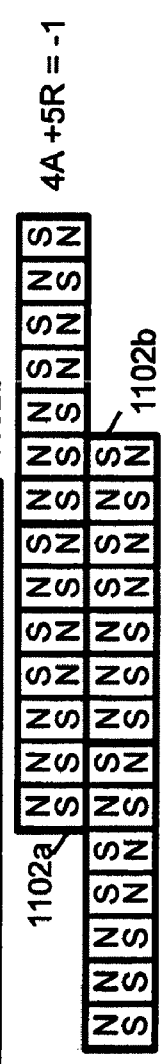
Figure 11K:
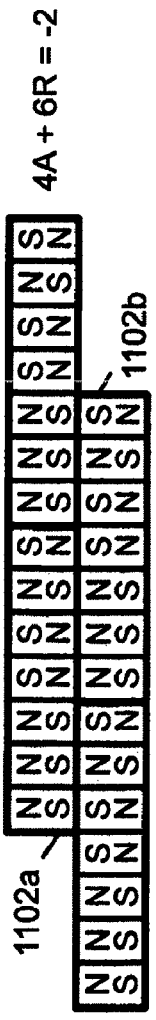
Figure 11L:
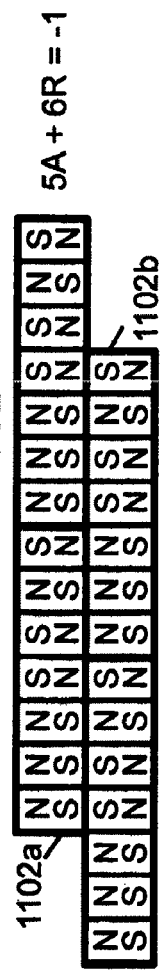
Figure 11M:
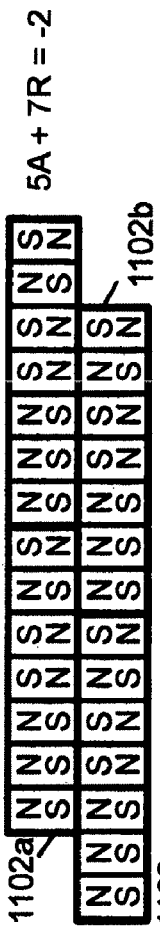
Figure 11N:
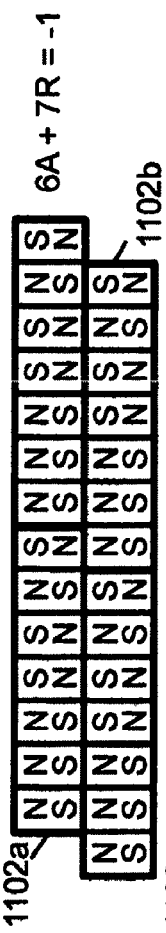
Figure 11O:
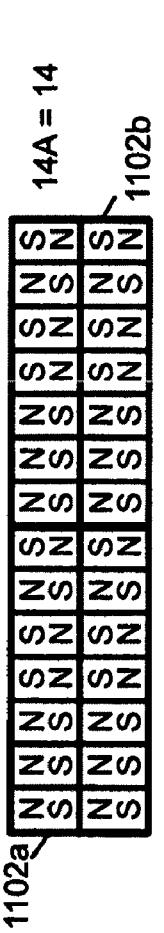
Figure 11P:
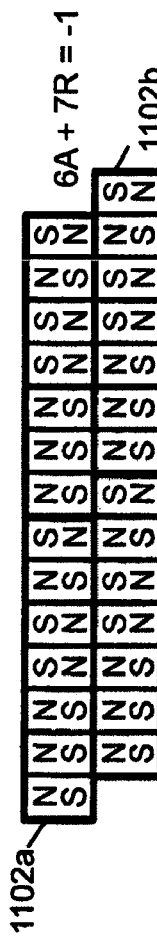
Figure 11Q:
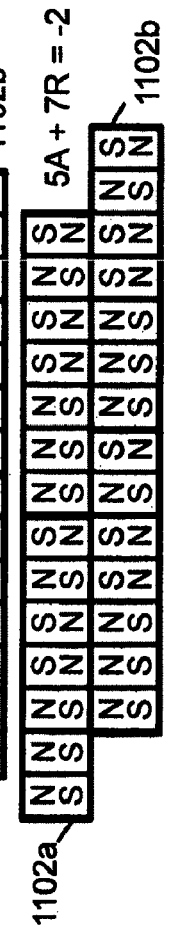
Figure 11R:
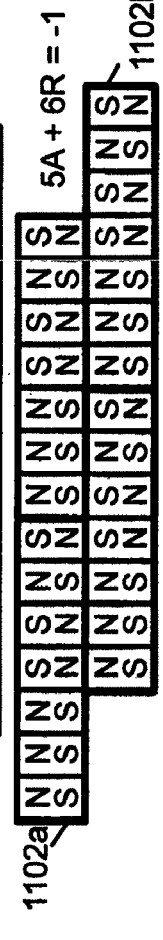
Figure 11S:
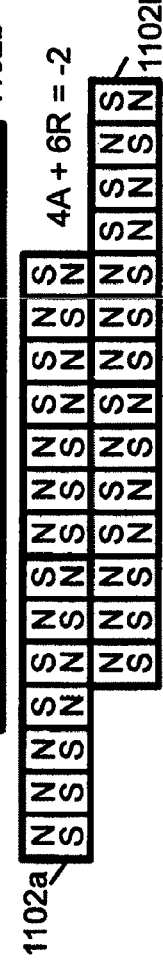
Figure 11T:
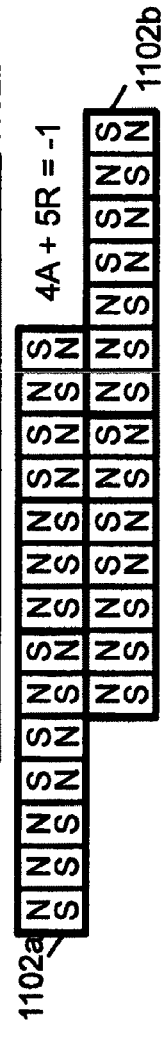
Figure 11U:
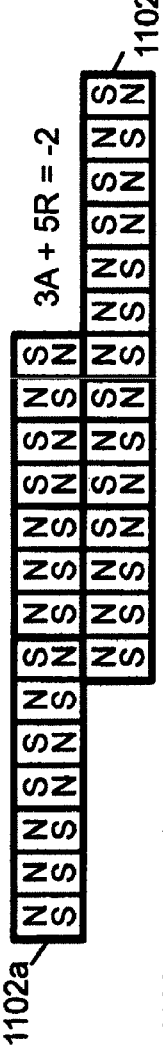
Figure 11V:
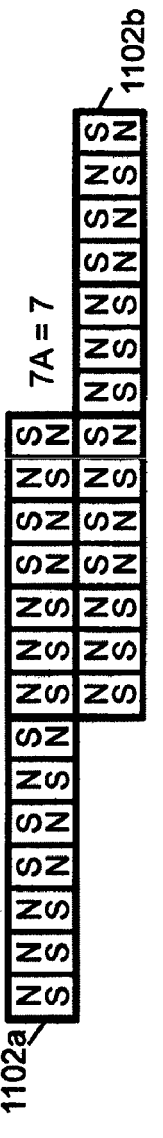
Figure 11A:
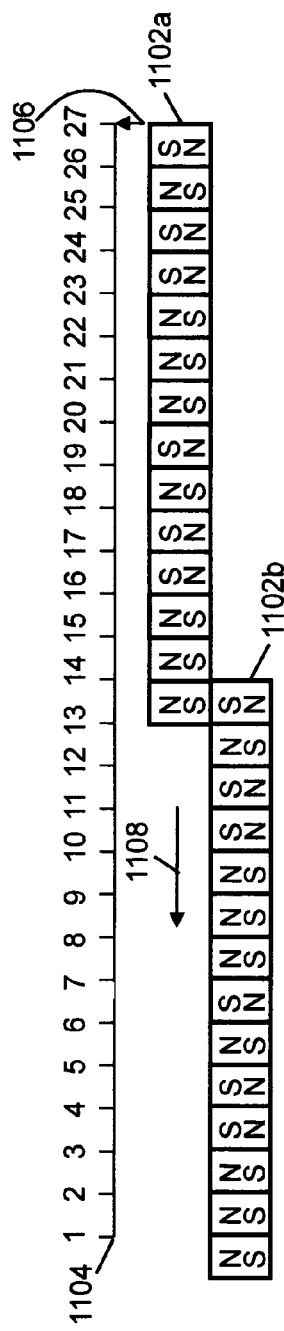
FIG. 11a depict a magnetic field structure that corresponds to two modulos of the Barker length 7 code end-to-end.

FIG. 11a depicts an exemplary cyclic code comprising two repeating code modulos of a Barker length 7 code. Referring to FIG. 11a, a Barker length 7 code is repeated two times to produce a magnetic field emission structure 1102.

FIGS. 11b through 11ab depict 27 different alignments of two magnetic field emission structures where a Barker code of length 7 is used to determine the polarities and the positions of magnets making up a first magnetic field emission structure 1102a, which corresponds to two modulos of the Barker length 7 code 500 end-to-end. Each magnet has the same or substantially the same magnetic field strength (or amplitude), which for the sake of this example is provided a unit of 1 (A=−R, A=1, R=−1). A second magnetic field emission structure 1102b that is identical to the first magnetic field emission structure 1102a is shown in 27 different alignments relative to the first magnetic field emission structure 1102a. For each relative alignment, the number of magnet pairs that repel plus the number of magnet pairs that attract is calculated, where each alignment has a spatial force in accordance with a spatial force function based upon the correlation function and magnetic field strengths of the magnets. With the specific Barker code used, the spatial force varies from −2 to 14, where the peak occurs when the two magnetic field emission structures are aligned such that their respective codes are aligned. Two secondary peaks occur when the structures are half aligned such that one of the successive codes of one structure aligns with one of the codes of the second structure. The off peak spatial force, referred to as the side lobe force, varies from −1 to −2 between the peak and secondary peaks and between 0 and −1 outside the secondary peaks.

FIG. 11ac depicts the sliding action shown in FIGS. 11b through 11ab in a single diagram. In FIG. 11ac, a first magnet structure 1102a is moved across the top of a second magnet structure 1102b in a direction 1108 according to a scale 1104. The first magnet structure 1102a is shown at position 27 according to an indicating pointer 1106, which moves with the right magnet of the first magnet structure 1102a. As the first magnet structure 1102a is moved from right to left, the total attraction and repelling forces are determined and plotted in the graph of FIG. 12.

Figure 12:
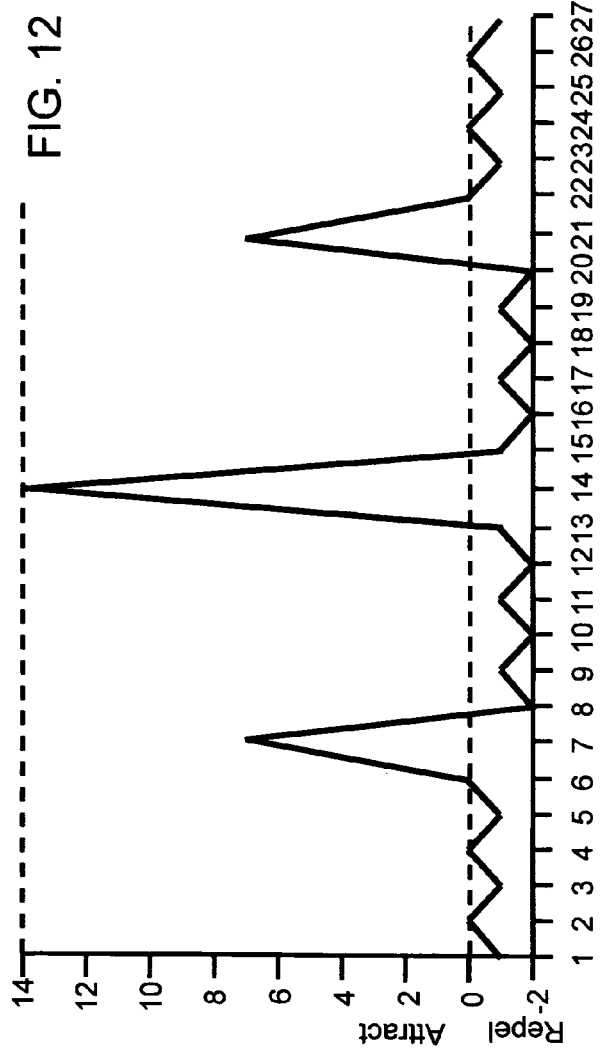
FIG. 12 depicts an exemplary spatial force function of the two magnetic field emission structures of FIGS. 11b-11ab and FIG. 11ac.

FIG. 12 depicts an exemplary spatial force function of the two magnetic field emission structures of FIGS. 11b through 11ab. Based on FIG. 6 and FIG. 10, FIG. 12 corresponds to the spatial functions in FIG. 6 and FIG. 10 added together.

The magnetic field emission structures disclosed so far are shown and described with respect to relative movement in a single dimension, i.e., along the interface boundary in the direction of the code. Some applications utilize such magnet structures by mechanically constraining the relative motion to the single degree of freedom being along the interface boundary in the direction of the code. Other applications allow movement perpendicular to the direction of the code along the interface boundary, or both along and perpendicular to the direction of the code, offering two degrees of freedom. Still other applications may allow rotation and may be mechanically constrained to only rotate around a specified axis, thus having a single degree of freedom (with respect to movement along the interface boundary.) Other applications may allow two lateral degrees of freedom with rotation adding a third degree of freedom. Most applications also operate in the spacing dimension to attract or repel, hold or release. The spacing dimension is usually not a dimension of interest with respect to the code; however, some applications may pay particular attention to the spacing dimension as another degree of freedom, potentially adding tilt rotations for six degrees of freedom. For applications allowing two lateral degrees of freedom, special codes may be used that place multiple magnets in two dimensions along the interface boundary.

Figure 13B:
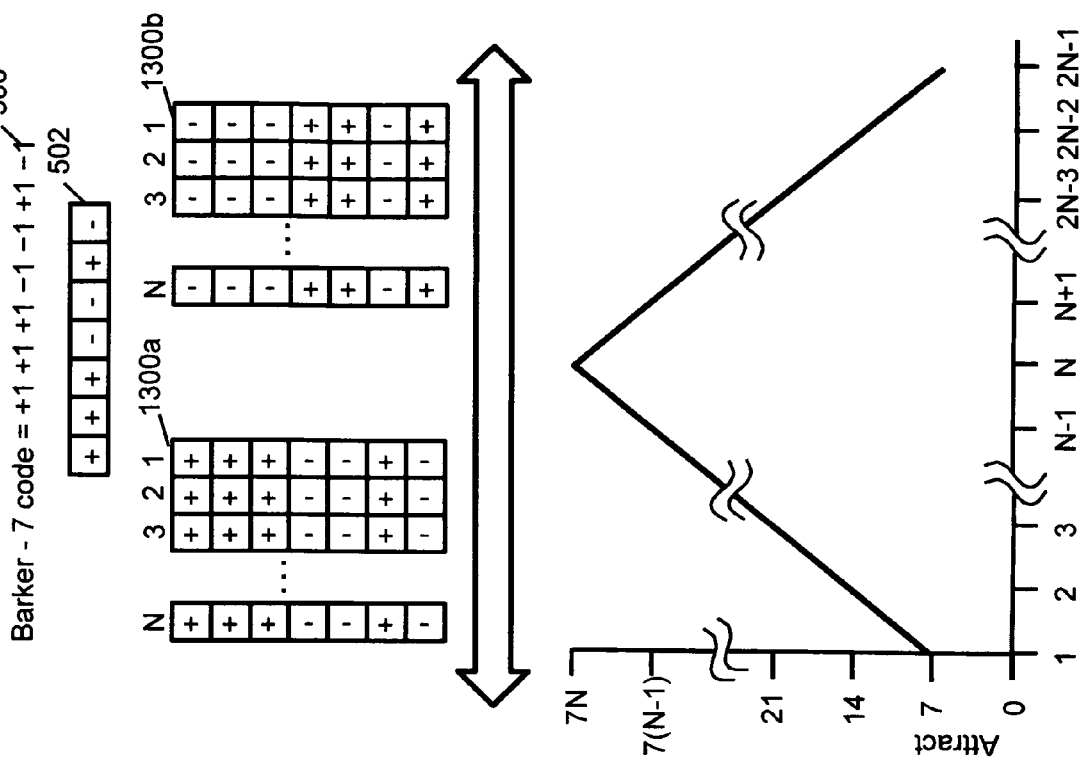
FIG. 13b depicts an exemplary spatial force function of magnetic field emission structures produced by repeating a one-dimensional code across a second dimension N times where movement maintains alignment with up to all N coded rows of the structure and down to one.
Figure 13A:
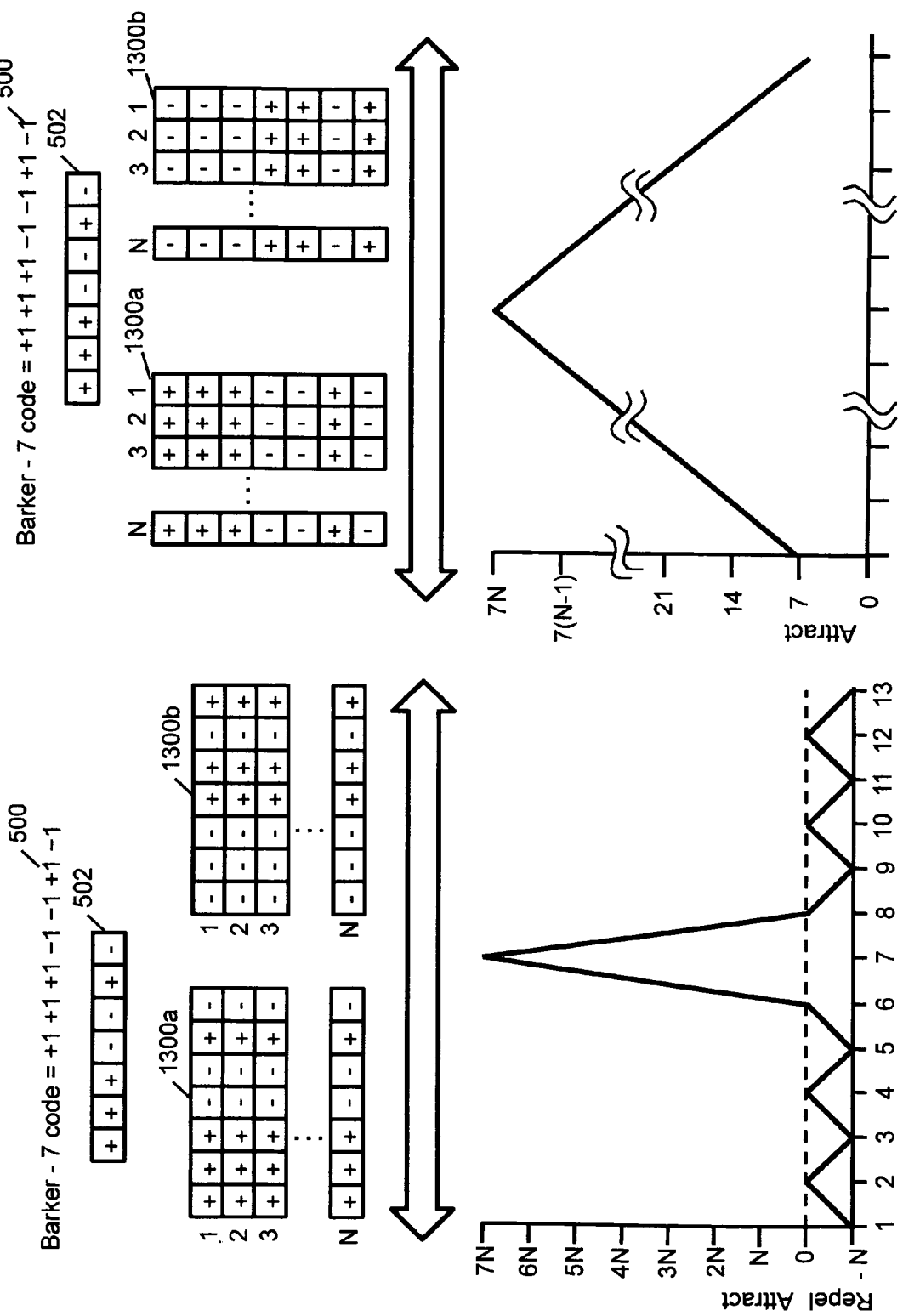
FIG. 13a depicts an exemplary spatial force function of magnetic field emission structures produced by repeating a one-dimensional code across a second dimension N times where movement is across the code.

FIG. 13a and FIG. 13b illustrate the spatial force functions of magnetic field emission structures produced by repeating a one-dimensional code across a second dimension N times (i.e., in rows each having same coding) where in FIG. 13a the movement is across the code (i.e., as in FIGS. 5b through 5o) or in FIG. 13b the movement maintains alignment with up to all N coded rows of the structure and down to one.

FIG. 14a depicts a two dimensional Barker-like code 1400 and a corresponding two-dimensional magnetic field emission structure 1402a. Referring to FIG. 14a, a two dimensional Barker-like code 1400 is created by copying each row to a new row below, shifting the code in the new row to the left by one, and then wrapping the remainder to the right side. When applied to a two-dimensional field emission structure 1402a interesting rotation-dependent correlation characteristics are produced. Shown in FIG. 14a is a two-dimensional mirror image field emission structure 1402b, which is also shown rotated −90°, −180°, and −270° as 1402c-1402e, respectively. Note that with the two-dimensional field emission structure 1402a, a top down view of the top of the structure is depicted such that the poles of each magnet facing up are shown, whereas with the two-dimensional mirror image field emission structure 1402b, 1402c, 1402d, 1402e a top down view of the bottom of the structure is depicted such that the poles of each magnet facing down are shown. As such, each magnet of the two-dimensional structure 1402a would be opposite a corresponding magnet of the mirror image structure 1402b, 1402c, 1402d, 1402e having opposite polarity. Also shown is a bottom view of the two-dimensional magnetic field structure 1402a'. One skilled in the art will recognize that the bottom view of the first structure 1402a' is also the mirror image of the top view of the first structure 1402a, where 1402a and 1402a' could be interpreted much like opposing pages of a book such that when the book closes the all the magnetic source pairs would align to produce a peak attraction force.

Autocorrelation cross-sections were calculated for the four rotations of the mirror image field emission structure 1402b-1402e moving across the magnetic field emission structure 1402a in the same direction 1404. Four corresponding numeric autocorrelation cross-sections 1406, 1408, 1410, and 1412, respectively, are shown. As indicated, when the mirror image is passed across the magnetic field emission structure 1402a each column has a net 1R (or −1) spatial force and as additional columns overlap, the net spatial forces add up until the entire structure aligns (+49) and then the repel force decreases as less and less columns overlap. With −90° and −270° degree rotations, there is symmetry but erratic correlation behavior. With −180° degrees rotation, symmetry is lost and correlation fluctuations are dramatic. The fluctuations can be attributed to directionality characteristics of the shift left and wrap approach used to generate the structure 1402a, which caused upper right to lower left diagonals to be produced which when the mirror image was rotated −180°, these diagonals lined up with the rotated mirror image diagonals.

Figure 14B:
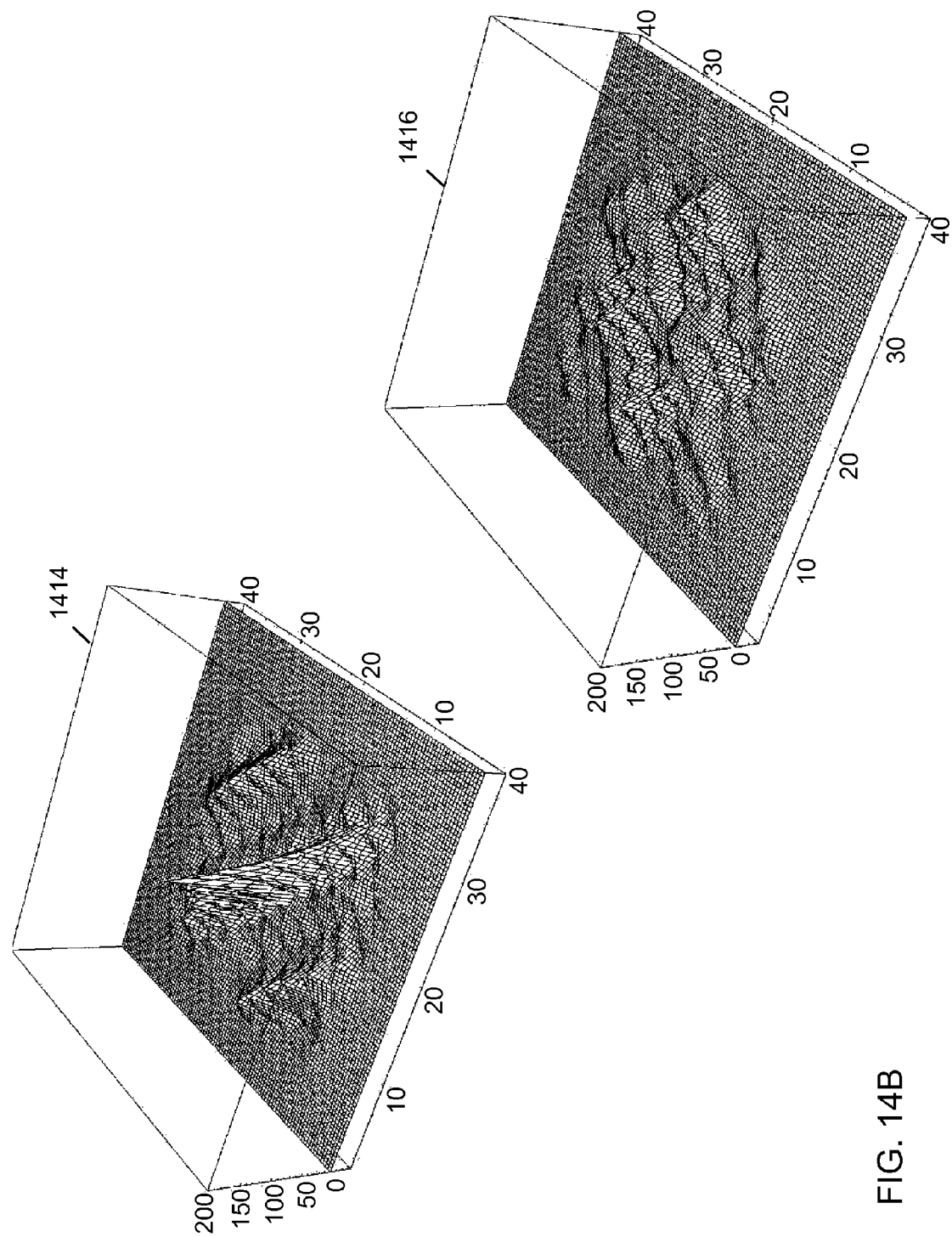
FIG. 14b depicts exemplary spatial force functions resulting from mirror image magnetic field emission structure and −90° rotated mirror image magnetic field emission structure moving across a magnetic field emission structure.

FIG. 14b depicts exemplary spatial force functions resulting from a mirror image magnetic field emission structure and a mirror image magnetic field emission structure rotated −90° moving across the magnetic field emission structure. Referring to FIG. 14b, spatial force function 1414 results from the mirror image magnetic field emission structure 1402b moving across the magnetic field emission structure 1402a in a direction 1404 and spatial force function 1416 results from the mirror image magnetic field emission structure rotated −90° 1402c moving across magnetic field emission structure 1402a in the same direction 1404. Characteristics of the spatial force function depicted in FIG. 12 may be consistent with a diagonal cross-section from 0,0 to 40,40 of spatial force function 1414 and at offsets parallel to that diagonal. Additionally, characteristics of the spatial force function depicted in FIG. 13b may be consistent with a diagonal from 40,0 to 0,40 of spatial force function 1414.

Figure 14C:
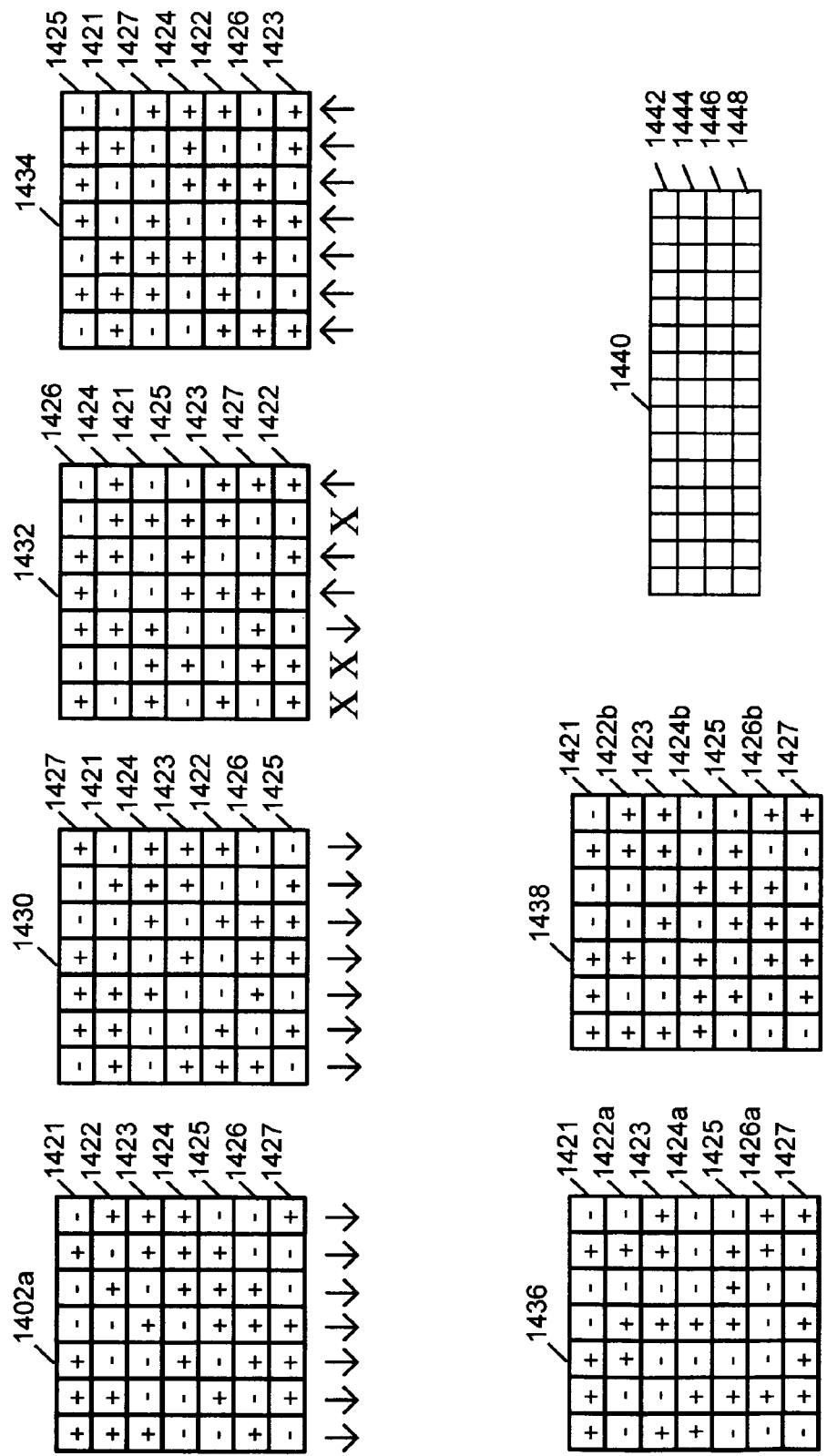
FIG. 14c depicts variations of a magnetic field emission structure where rows are reordered randomly in an attempt to affect its directionality characteristics.

FIG. 14c depicts variations of magnetic field emission structure 1402a where rows are reordered randomly in an attempt to affect its directionality characteristics. As shown, the rows of 1402a are numbered from top to bottom 1421 through 1427. A second magnetic field emission structure 1430 is produced by reordering the rows to 1427, 1421, 1424, 1423, 1422, 1426, and 1425. When viewing the seven columns produced, each follows the Barker 7 code pattern wrapping downward. A third magnetic field emission structure 1432 is produced by reordering the rows to 1426, 1424, 1421, 1425, 1423, 1427, and 1422. When viewing the seven columns produced, the first, second, and sixth columns do not follow the Barker 7 code pattern while the third column follows the Barker 7 code pattern wrapping downward while the fourth, fifth and seven columns follow the Barker 7 code pattern wrapping upward. A fourth magnetic field emission structure 1434 is produced by reordering the rows 1425, 1421, 1427, 1424, 1422, 1426, and 1423. When viewing the seven columns produced, each follows the Barker 7 code pattern wrapping upward. A fifth magnetic field emission structure 1436 is produced by reversing the polarity of three of the rows of the first magnetic field emission structure 1402a. Specifically, the magnets of rows 1422a, 1424a and 1426a are reversed in polarity from the magnets of rows 1422, 1424, and 1426, respectively. Note that the code of 1402a has 28 "+" magnets and 21 "−" magnets; whereas, alternative fifth magnetic field emission structure 1436 has 25 "+" magnets and 24 "−" magnets—a nearly equal number. Thus, the far field of fifth magnetic field from structure 1436 will nearly cancel to zero, which can be valuable in some applications. A sixth magnetic field emission structure 1438 is produced by reversing the direction of three of the rows. Specifically, the direction of rows 1422b, 1424b and 1426b are reversed from 1422, 1424, and 1426, respectively. A seventh magnetic field emission structure 1440 is produced using four codes of low mutual cross correlation, for example four rows 1442, 1444, 1446, and 1448 each having a different 15 length Kasami code. Because the rows have low cross correlation and low autocorrelation, shifts either laterally or up and down (as viewed on the page) or both will result in low magnetic force. Generally, two dimensional codes may be generated by combining multiple single dimensional codes. In particular, the single dimensional codes may be selected from sets of codes with known low mutual cross correlation. Gold codes and Kasami codes are two examples of such codes, however other code sets may also be used.

More generally, FIG. 14c illustrates that two dimensional codes may be generated from one dimensional codes by assembling successive rows of one dimensional codes and that different two dimensional codes may be generated by varying each successive row by operations including but not limited to changing the order, shifting the position, reversing the direction, and/or reversing the polarity.

Additional magnet structures having low magnetic force with a first magnet structure generated from a set of low cross correlation codes may be generated by reversing the polarity of the magnets or by using different subsets of the set of available codes. For example, rows 1442 and 1444 may form a first magnet structure and rows 1446 and 1448 may form a second magnet structure. The complementary magnet structure of the first magnet structure will have low force reaction to the second magnet structure, and conversely, the complementary magnet structure of the second magnet structure will have a low force reaction to the first magnet structure. Alternatively, if lateral or up and down movement is restricted, an additional low interaction magnet structure may be generated by shifting (rotating) the codes or changing the order of the rows. Movement may be restricted by such mechanical features as alignment pins, channels, stops, container walls or other mechanical limits.

Figure 14D:
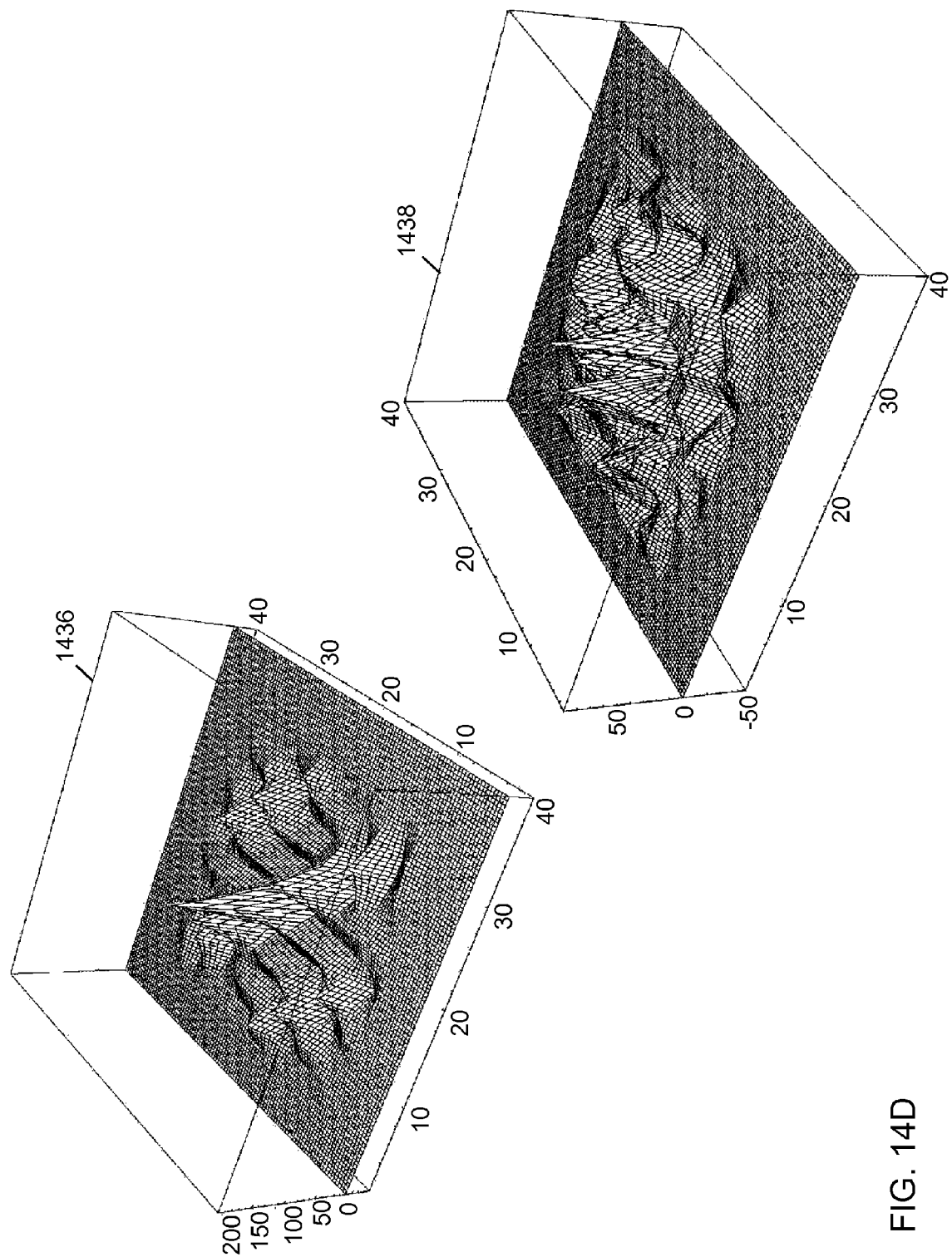
FIGS. 14d and 14e depict exemplary spatial force functions of selected magnetic field emission structures having randomly reordered rows moving across mirror image magnetic field emission structures both without rotation and as rotated −90, respectively.

FIG. 14d depicts a spatial force function 1450 resulting from the second magnetic field emission structure 1430 moving across its mirror image structure in one direction 1404 and a spatial force function 1452 resulting from the second magnetic field emission structure 1430 after being rotated −90° moving in the same direction 1404 across the mirror image of the second magnetic field emission structure 1430.

Figure 14E:
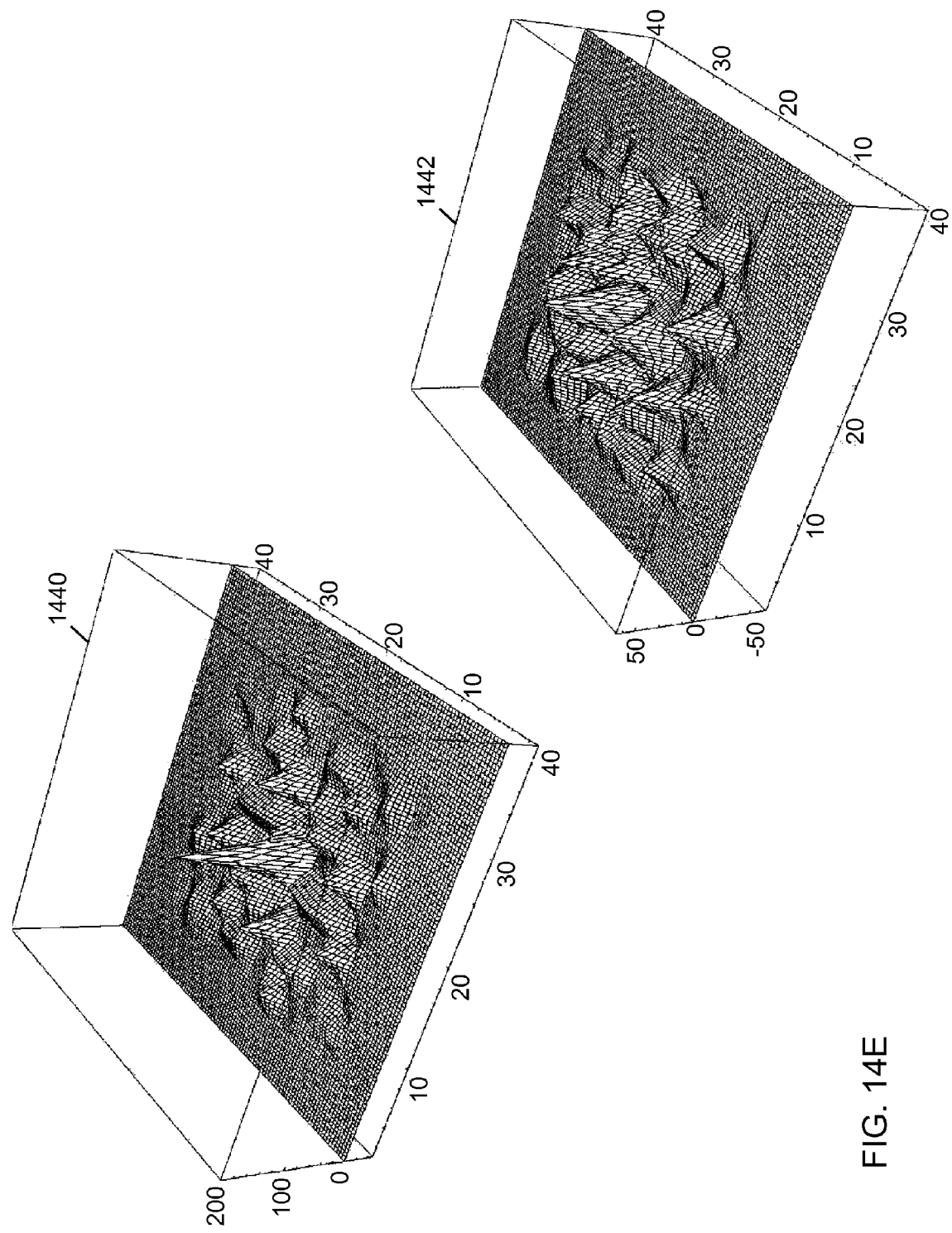

FIG. 14e depicts a spatial force function 1454 resulting from fourth magnetic field emission structure 1434 moving across its mirror image magnetic field emission structure in a direction 1404 and a spatial force function 1456 resulting from the fourth magnetic field emission structure 1434 being rotated −90° and moving in the same direction 1404 across its mirror image magnetic field emission structure.

Figure 15:
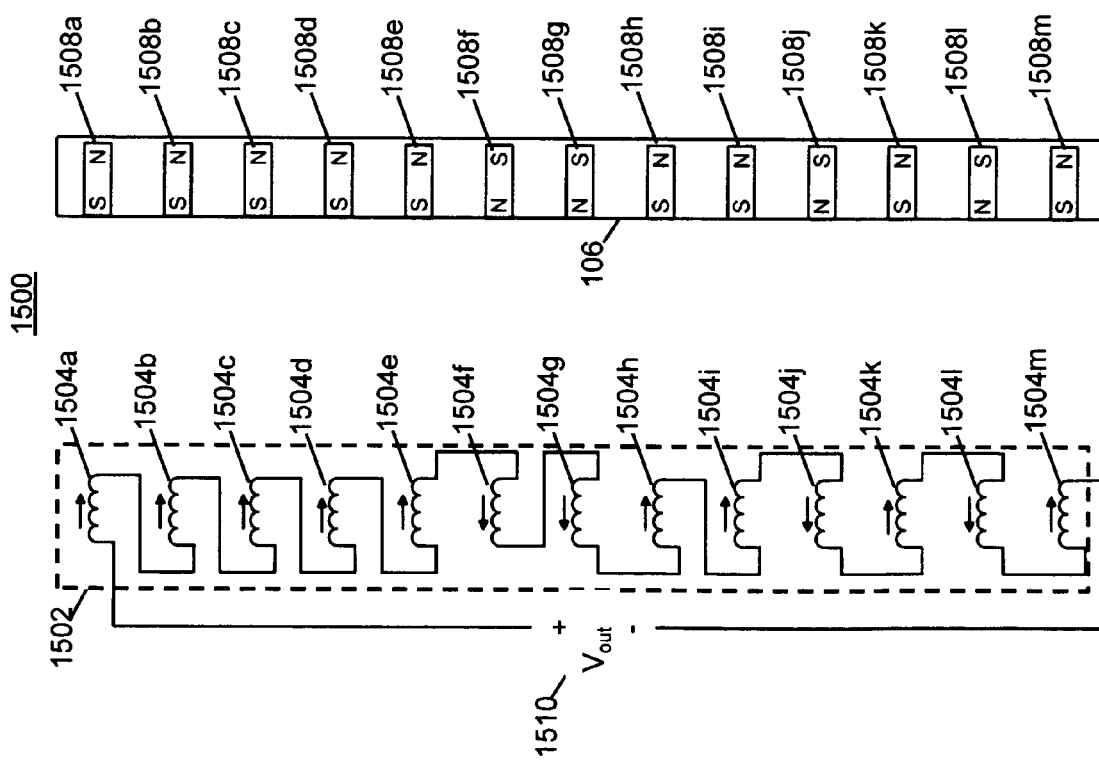
FIG. 15 depicts an exemplary system for producing an electric pulse in accordance with an embodiment of the present invention.

Turning now to FIG. 15, embodiments of the present invention expand on the aforementioned revolutionary coded magnetism technology to provide techniques for generating electrical pulses using correlated inductance. Unlike correlated magnetism, which involves correlation of a first magnetic field emission structure with a second magnetic field emission structure to produce a magnetic attract or repel force in accordance with a spatial force function (or spatial magnetic force function), embodiments of the present invention involve correlation of a magnetic field emission structure with a coil structure to produce an electromotive force in accordance with a spatial electromotive force function. However, even with this substitution of the coil structure for the second magnetic field emission structure, the coding techniques described above and in the patent applications incorporated by reference will still be valid and useful in the present invention. Moreover, one skilled in the art will recognize that, if the same coding is employed, the correlation between two magnetic field structures is very much like the correlation between a magnetic field emission structure and a coil structure. Although, as opposed to the spatial magnetic force function described above where a produced magnetic force corresponds to a given relative alignment in time between two magnetic field emission structures that can remain stationary, embodiments of the present invention produce an electromotive force that corresponds to a given relative alignment in time between a magnetic field structure and a coil structure where at least one of the two structures must be moving. For FIGS. 15-19D, an exemplary Barker 13 code is used. However, one skilled in the art will recognize that many different types of codes can be used included any of the codes described above and in the patent applications incorporated by reference herein.

Figure 16A:
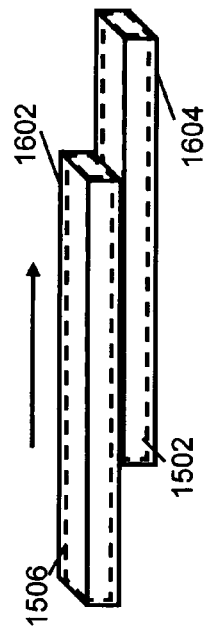
FIGS. 16A-16C depict exemplary alignments of a first object with a second object of embodiments of the present invention.
Figure 16B:
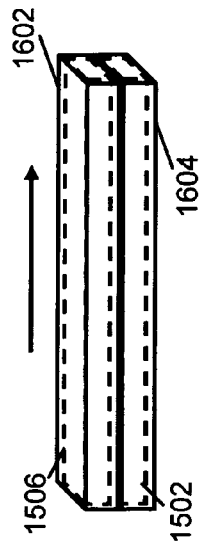
Figure 16C:
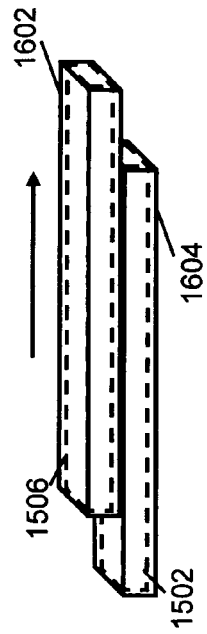

FIG. 15 depicts an exemplary system for producing an electric pulse in accordance with embodiments of the present invention. Referring to FIG. 15, a system 1500 for producing an electric pulse comprises a coil structure 1502 having thirteen coils 1504a-1504m that have positions and serial wiring (corresponding to a polarity of current direction) defined in accordance with a Barker-13 code. The system 1500 also comprises a magnetic field structure 1506 having thirteen magnetic field sources 1508a-1508m that have positions and polarities defined in accordance with the Barker-13 code. Each coil 1504a-1504m of the coil structure 1502 has a corresponding magnetic field source 1508a-1508m of the magnetic field structure 1506. As such, when the coil structure 1502 is moved across the magnetic field structure 1506 (or vice versa), an electric pulse is produced at output terminals 1510 at the precise moment when the coil structure 1502 becomes substantially aligned with the magnetic field structure 1506 such that the corresponding coils 1504a-1504m and magnetic field sources 1508a-1508m align. In practice, the depicted magnetic field structure 1506 can be turned such that the poles shown on the left side of the magnetic field sources 1508a-1508m would face downward when moved across the coil structure 1502 to produce a positive electric pulse. Alternatively, the depicted magnetic field structure 1506 can be turned such that the poles shown on the right side of the magnetic field sources 1508a-1508m would face downward when moved across the coil structure 1502 to produce a negative electric pulse FIGS. 16A-16C depict exemplary alignments of a first object 1602 with a second object 1604. The first object 1602 has associated with it the magnetic field structure 1606 and the second object has associated with it the coil structure 1602. As such, FIGS. 16A-16C depict the first object 1602 moving across the second object 1604 where the coil structure 1602 and magnetic field structure are shown to be substantially aligned in FIG. 16B. Alternatively, the first object 1602 could have associated with it the coil structure 1502 and the second object could have associated with it the magnetic field structure 1506. Under either arrangement, the movement of two objects can have many possible partial alignments that do not produce the desired electric pulse but will correlate when substantially aligned to produce the desired electric pulse.

FIG. 17 depicts an exemplary correlation function 1700 showing voltage produced by coil structure 1502 given 25 relative alignments of the coil structure 1502 and the magnetic field structure 1506, which represent the possible alignments of the coils and magnetic field sources as the magnetic field structure 1506 passes across the coil structure 1502 such as depicted in FIGS. 16A-16C. One skilled in the art will recognize that the electric pulse 1702 is produced when all 13 coils 1504a-1504m are aligned with their corresponding magnetic field sources 1508a-1508m. The correlation function can also be referred to as a spatial electromotive force function.

Figure 18B:
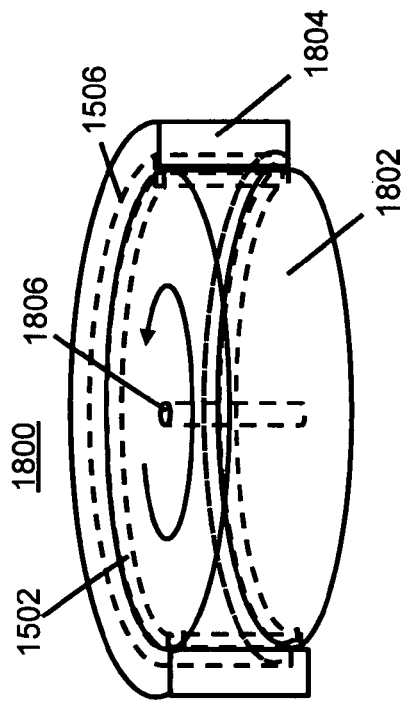
FIGS. 18A and 18B depict another exemplary system for producing an electric pulse in accordance with embodiments of the present invention.
Figure 18D:
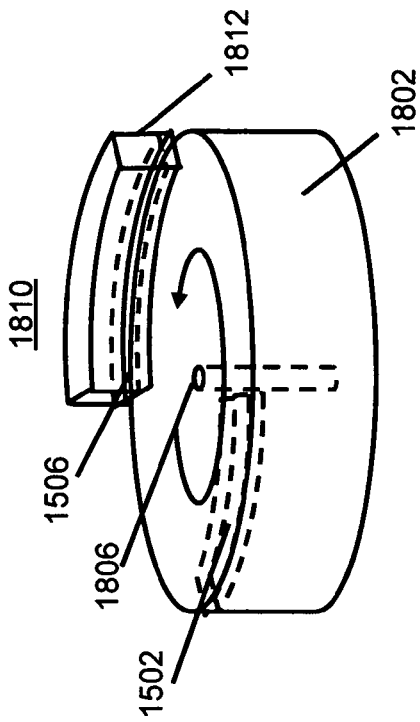
FIG. 18D depicts still another exemplary system for producing an electric pulse in accordance with embodiments of the present invention.
Figure 18A:
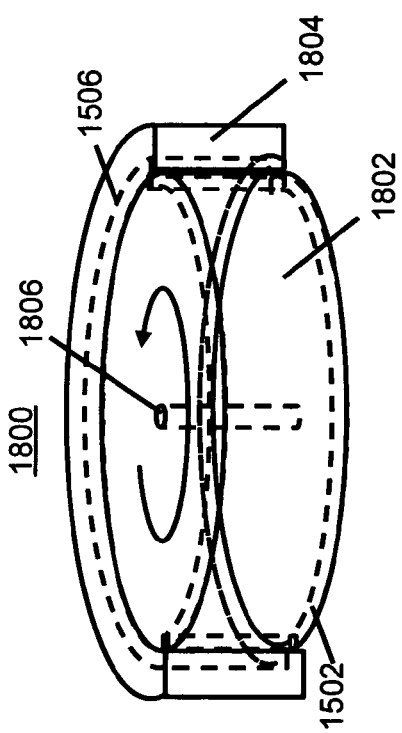

FIGS. 18A and 18B depict another exemplary system for producing an electric pulse in accordance with embodiments of the present invention. Referring to FIG. 18A, the system 1800 comprises a wheel 1802 (e.g., a flywheel) having associated with it a coil structure 1502. As shown, the coil structure 1502 is embedded inside the wheel but it can be otherwise configured such that its coils cover the outside of the wheel. In the example system 1800, the coil structure 1502 covers approximately half of the circumference of the wheel 1802, although the present invention is not limited in this respect. The system 1800 also comprises a half arch-like structure 1804 having associated with a magnetic field structure 1506. The wheel 1802 is able to turn inside the half arch-like structure 1804 about an axis 1806. As it turns, the coils 1504-1504b of the coil structure 1502 will achieve different alignments with the magnetic field sources 1508a-1508m of the magnetic field structure 1506. When all 13 coils 1504a-1504m are aligned with their corresponding magnetic field sources 1508a-1508m, as depicted in FIG. 18B, an electric pulse will be produced. Again, 13 coils are used here as only an illustrative example and any plurality of coils are anticipated to be within the scope of the present invention.

Figure 18C:
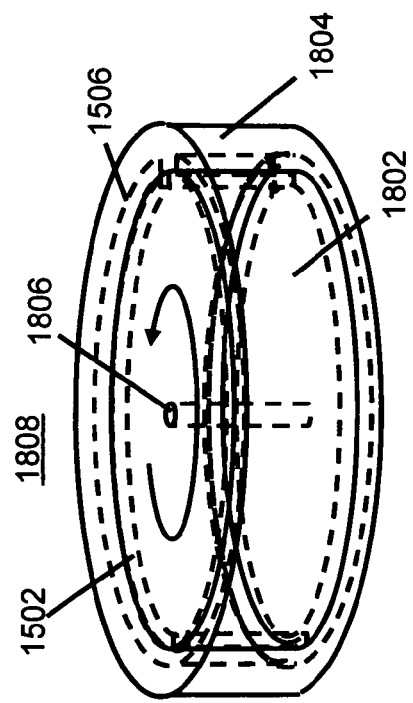
FIG. 18C depicts yet another exemplary system for producing an electric pulse in accordance with embodiments of the present invention.

FIG. 18C depicts yet another exemplary system for producing an electric pulse in accordance with the present invention. Referring to FIG. 18C, the exemplary system 1808 is similar to the exemplary system shown in FIGS. 18A and 18B except the coil structure 1502 is shown covering the entire circumference of the wheel 1802, the arch-like structure 1804 now resembles a donut structure since it completely surrounds wheel 1802, and the magnetic field structure 1506 also surrounds the coil structure 1502. One skilled in the art will recognize that this arrangement corresponds to a code wrap around the wheel/donut structure. As with the previous system 1800, the exemplary system 1808 will also produce an electric pulse when all 13 coils 1504a-1504m are aligned with their corresponding magnetic field sources 1508a-1508m, as depicted in FIG. 18B. One skilled in the art will also recognize that because of the code wrapping, the correlation function shown in FIG. 17 would be varied somewhat in that the voltage would be 1 for each of the alignments other than the 13th alignment, which would remain the same.

FIG. 18D depicts still another exemplary system for producing an electric pulse in accordance with the present invention. Referring to FIG. 18D, the exemplary system 410 differs from the previous systems of FIGS. 18A-18C in that the coil structure 1502 is on the top of the wheel 1802 instead of on the outside. Similarly, the magnetic field structure 1506 is on the bottom of a partial arch structure 1812 shown positioned above the wheel such that as the wheel 1802 spins about the axis 1806, the substantial alignment of all 13 coils 1504a-1504m with their corresponding magnetic field sources 1508a-1508m can occur to produce an electric pulse. One skilled in the art will recognize that the half arch, donut shape, and partial arch shapes used in the exemplary systems of FIGS. 18A-18C were exemplary and could be changed to many different desired shapes to practice the invention. Furthermore, the locations of the coils structure 1502 and magnetic field structure 1506 can be interchanged in each of the exemplary systems.

The electric pulse produced can serve many useful functions, for example, ignition of fuel in an engine, such as a 2-cycle engine, where the invention can be described as a correlated magneto system. Furthermore, the electric pulse can be used in a control system to indicate the event of a first object being in a precise position relative to a second object at a precise instance in time. As such, the invention can be used as a precision position measurement device, which might alternatively be described as being a precision (event) timing device. Such precision timing devices can be useful for various applications such as sports timing, control systems, etc.

Figure 19:
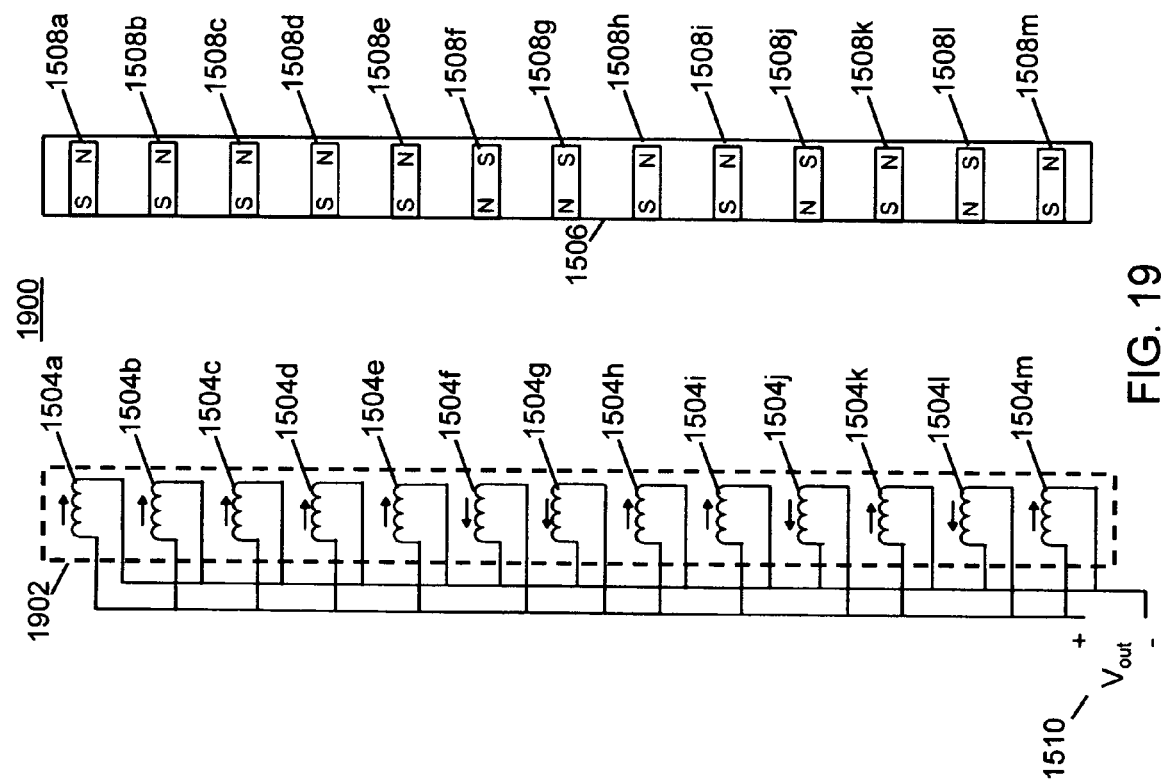
FIG. 19 depicts a further exemplary system for producing an electric pulse in accordance with embodiments of the present invention.

FIG. 19 depicts a further exemplary system for producing an electric pulse in accordance with embodiments of the present invention. Referring to FIG. 19, a system 1900 for producing an electric pulse comprises a coil structure 1902 having thirteen coils 1504a-1504m that have positions and parallel wiring (corresponding to a polarity of current directions) defined in accordance with a Barker-13 code. The system 1900 also comprises magnetic field structure 1506 having thirteen magnetic field sources 1508a-1508m that have positions and polarities defined in accordance with the Barker-13 code. Each coil 1504a-1504m of the coil structure 1902 has a corresponding magnetic field source 1508a-1508m of the magnetic field structure 1506. As such, when the coil structure 1902 is moved across the magnetic field structure 1506 (or vice versa), an electric pulse is produced at output terminals 1510 at the precise moment that the coil structure 1902 becomes substantially aligned with the magnetic field structure 1506 such that the corresponding coils 1504a-1504m and the magnetic field sources 1508a-1508m align. In practice, the depicted magnetic field structure 1506 can be turned such that the poles shown on the left side of the magnetic field sources 1508a-1508m would face downward when moved across the coil structure 1902 to produce a positive electric pulse. Alternatively, the depicted magnetic field structure 1506 can be turned such that the poles shown on the right side of the magnetic field sources 1508a-1508m would face downward when moved across the coil structure 1902 to produce a negative electric pulse.

Figure 20:
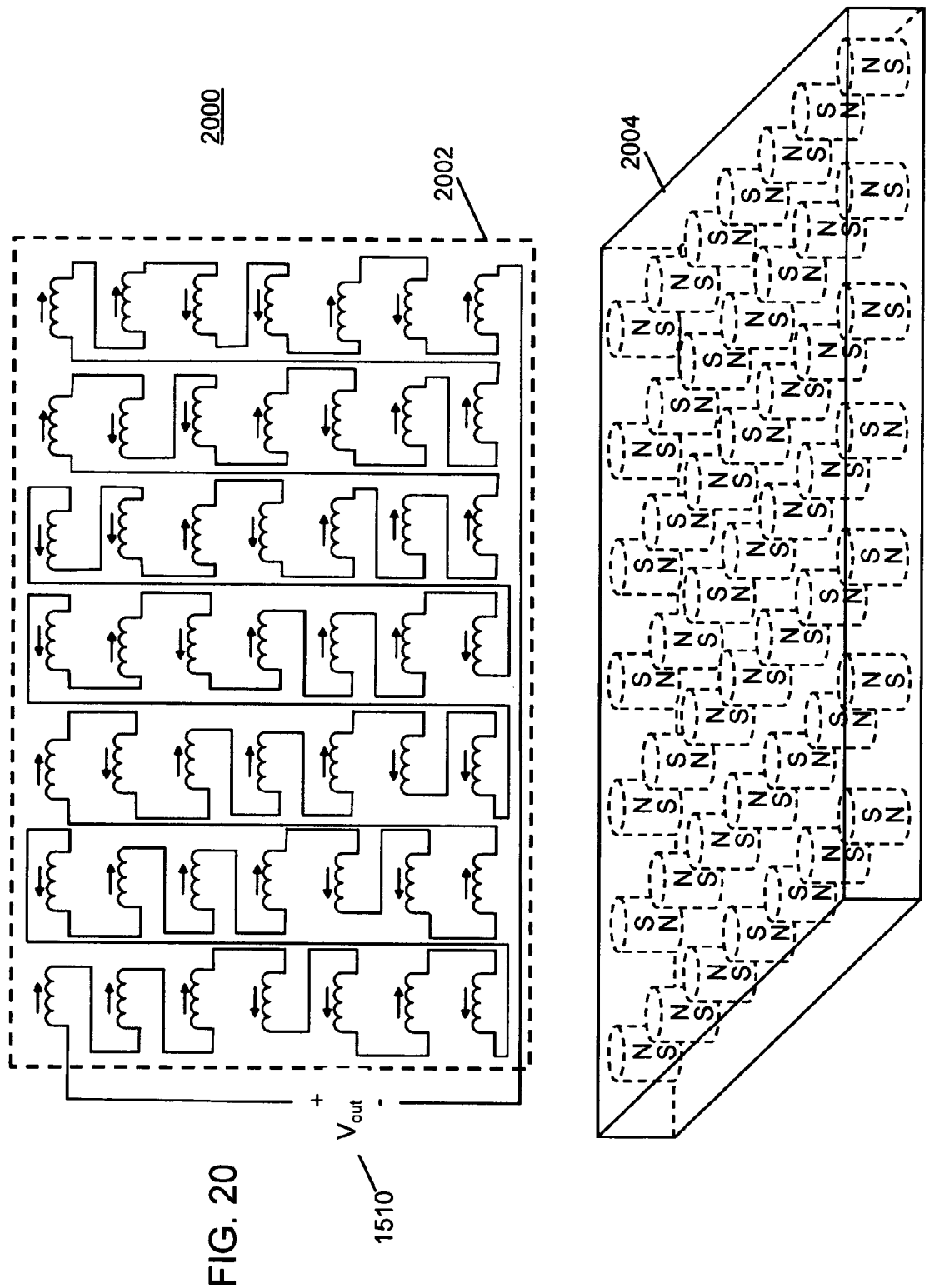
FIG. 20 depicts an exemplary two-dimensional version of the system for producing an electric pulse in accordance with some embodiments of the present invention.

FIG. 20 depicts an exemplary two-dimensional version of the system for producing an electric pulse in accordance with some embodiments of the present invention. Referring to FIG. 20, two-dimensional system 2000 includes a coil structure 2002 that has seven columns of coils each having positions and serial wiring corresponding to a different "7 code wrap" of a Barker 7 code. A Barker 7 code is described above and in the patent applications incorporated by reference herein. The two-dimensional system 2000 may also include a magnetic field structure 2004 and have seven columns of magnetic field sources each having positions and polarities in accordance with the same coding as coil structure 2002. As such, when the magnetic field structure 2004 is placed on top of the coil structure 2002, there is one alignment where each coil of the coil structure 2002 will align with its corresponding magnetic field source of the magnetic field structure 2004 to produce an electric pulse at the output terminals 1510.

One skilled in the art will recognize that the coil structure 2002 could be replaced by a coil structure having parallel wiring or any of various combinations of serial and parallel wiring. For example, each of the coils of the coil structure 2002 could be wired in parallel in a manner consistent with the coil structure 1902 of FIG. 19. Alternatively, each column of coils of the coil structure 2002 might be wired in series and the outputs of each of the columns might be connected in parallel. Generally, one skilled in the art will understand that such wiring alternatives are design decisions and that alternative wiring designs might be desirable to support various applications of the invention.

Electric pulses produced by such two-dimensional systems can be used as described above (e.g., for ignition, precision position determination, and precision event timing purposes), but also may be used for determining and measuring precision alignment of two objects. Moreover, an in-phase and quadrature (I&Q) coil arrangement can be employed to produce a control system for controlling movement of one or both objects as necessary to achieve alignment. Additionally, the three-dimensional spatial electromotive force function corresponding to the two-dimensional system 2000 (or other two-dimensional systems) can be used to determine the relative positions of two objects having associated with them the coil structure 2002 and the magnetic field structure 2004. Specifically, the relative positions of the two objects can be determined by comparing the three-dimensional spatial electromotive force function to measurements of the output voltage as the two objects move relative to each other. Such measurements can be used to vary movement of at least one of the objects for guidance control purposes.

FIG. 21A depicts still another exemplary system for producing an electric pulse in accordance with embodiments of the present invention. Referring to FIG. 21A, a system 2100 for producing an electric pulse comprises a coil structure 2102 having seven primary coils 1504a-1504g and seven secondary coils 2104a-2104g that have positions and serial wiring (corresponding to a polarity of current directions) defined in accordance with a Barker-7 code. The system 2100 also comprises a magnetic field structure 106 having seven magnetic field sources 1508a-1508g that have positions and polarities defined in accordance with the Barker-7 code. Each primary coil 1504a-1504g of the coil structure 2102 has a corresponding magnetic field source 1508a-1508g of the magnetic field structure 1506. As the magnetic field structure 1506 is moved across the primary coils 1504a-1504g, a voltage is collected in a capacitor 2112. As such, a peak voltage is achieved in the capacitor 2112 at the precise moment that the coil structure 2102 becomes substantially aligned with the magnetic field structure 1506 such that the corresponding coils 1504a-1504g and magnetic field sources 1508a-1508g align. Simultaneously, a normally closed switch 2110 is opened causing a voltage (back electromotive force) transient to be generated across the primary coils 1504a-1504g and the corresponding secondary coils 2104a-2104g thereby resulting in an electric pulse being produced at the output terminals 1510, which might correspond to a spark plug. The switch 2110 is connected between a ground 2106 and the primary coils of the coil structure 2102. In practice, the depicted magnetic field structure 1506 can be turned such that the poles shown on the left side of the magnetic field sources 1508a-1508g would face downward when moved across the primary coils of 1504a-1504g of the coil structure 2102 to produce a positive electric pulse. Alternatively, the depicted magnetic field structure 1506 can be turned such that the poles shown on the right side of the magnetic field sources 1508a-1508g would face downward when moved across the primary coils of 1504a-1504g of the coil structure 2102 to produce a negative electric pulse.

FIG. 21B depicts an alternative exemplary system for producing an electric pulse in accordance with the invention. Referring to FIG. 21B, a system 2114 for producing an electric pulse comprises a coil structure 2116 having seven primary coils 1504a-1504g and seven secondary coils 2104a-2104g that have positions and parallel wiring (corresponding to a polarity of current directions) defined in accordance with a Barker-7 code. One skilled in the art will recognize that the coil structure 2116 could be replaced by a coil structure having any of various combinations of serial and parallel wiring. For example, each of the primary coils of the coil structure 2002 could be wired in parallel while the secondary coils could be wired in series. Alternatively, the primary coils could be wired in series and the secondary coils could be wired in parallel. Additionally, each of the primary coils could have its own capacitor and switch. Generally, one skilled in the art will understand that such wiring alternatives are design decisions and that alternative wiring designs might be desirable to support various applications of the invention.

Figure 22B:
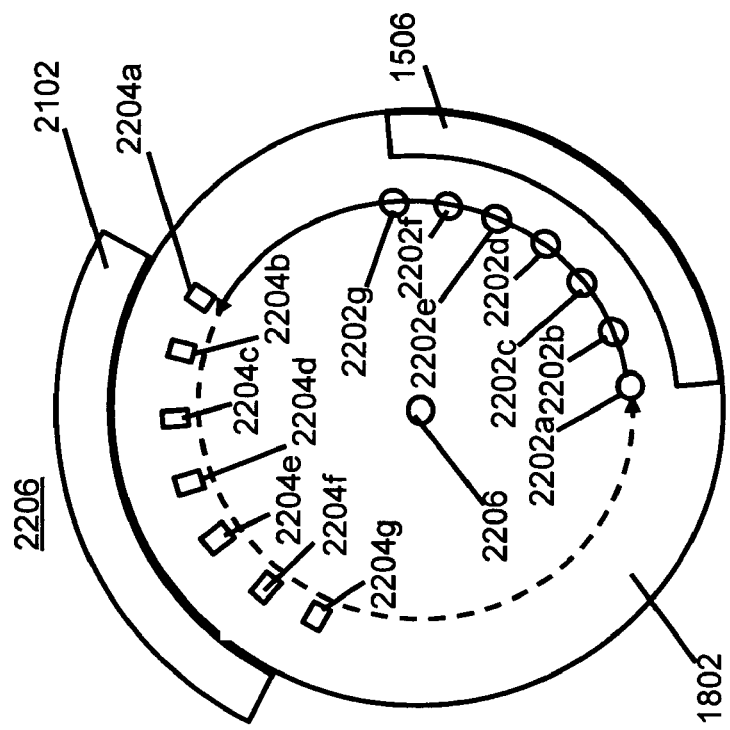
FIG. 22B is an illustration similar to FIG. 22A except it depicts magnets that are associated with switches and capacitors of an alternative coil structure of embodiments of the present invention.
Figure 22A:
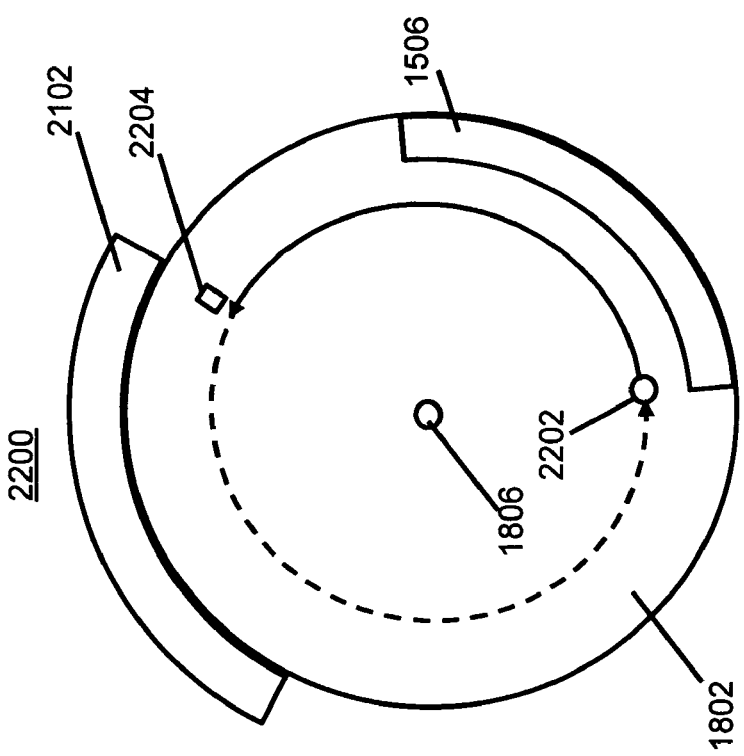
FIG. 22A depicts a top down view of a wheel having a magnetic field structure installed along a portion of its side according to an embodiment of the present invention.

FIG. 22A depicts a top down view of an ignition system 2200 comprising a wheel 1802 having a magnetic field structure 1506 installed along a portion of its side. As the wheel 1802 spins about an axis 1806 the magnetic field structure 1506 aligns with the primary coils of the coil structure 2102 attached to a second object near the wheel 1802. Also depicted in FIG. 22A is a magnet 2202 positioned on top of the wheel 1802 that spins along with the wheel 1802 and along with the magnetic field structure 1506. At the precise moment when the magnetic field structure 1506 aligns with the coil structure 2102, the magnet 2202 aligns with a normally closed switch 2204, for example a reed switch, causing it to open.

FIG. 22B depicts a top down view of an ignition system 2206 that is similar to the ignition system 2202 depicted in FIG. 22A except the ignition system 2206 depicts seven magnets 2202a-2202g that are associated with the seven switches and capacitors of an alternative coil structure as described in relation to FIG. 21B where each primary coil has its own switch and capacitor. As the wheel 1802 spins, the seven magnets 2202a-2202g align with their corresponding switches 2204a-2204g at the precise moment that the magnetic field structure 1506 aligns with the coil structure 2102. Under one arrangement, the magnets 2202a-2202g and switches 2204a-2204g are arranged in accordance with a code such that they are all open only when the magnets and switches are all aligned.

Figure 23:
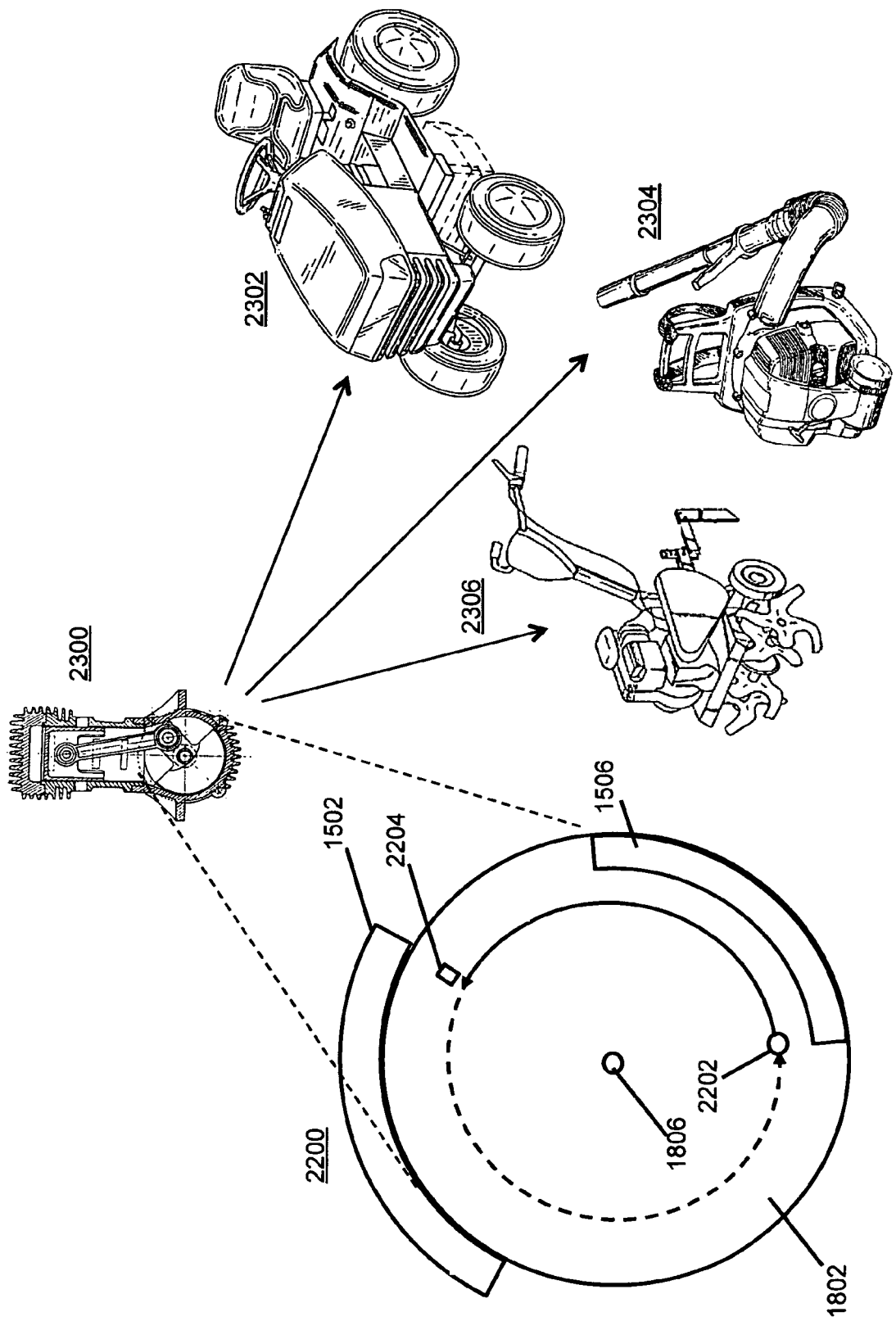
FIG. 23 illustrates an embodiment of the present invention as used in an ignition system of a two-cycle engine.

FIG. 23 provides an illustration depicting the present invention as it may be used in an ignition system 2200 of an engine 2300. Further, the ignition system 2200 may be utilized in devices such as two-cycle motors used in a lawn mower 2302, a leaf blower 2304 and a tiller 2306. It is understood that these are just a few illustrative uses for two-cycle engines and that the two-cycle engine is just an illustrative example of the use of the ignition system and the ignition system is just one of many uses for the electric pulse generation of embodiments of the present invention.

Figure 24C:
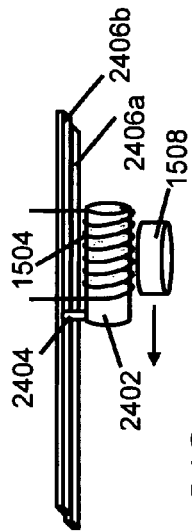
FIGS. 24C-24D depict exemplary connectivity of ferromagnetic material within coils oriented parallel to the direction of movement of corresponding magnets.
Figure 24A:
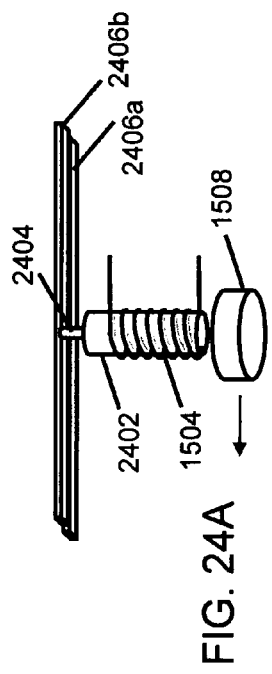
FIGS. 24A-24B depict exemplary connectivity of ferromagnetic material within coils oriented perpendicular to the direction of movement of corresponding magnets.

FIG. 24A depicts a coil 1504 oriented perpendicular to the direction of movement of a magnet 1508. The coil 1504 is connected to other coils in accordance with a code. The coil 1504 surrounds a core 2402 having high magnetic permeability, for example iron. The core 2402 is connected by a connector 2404 to one or the other of two conductor bars 2406a, 2406b in accordance with the code. Under one arrangement, the connector 2404 and the two conductor bars 2406a, 2406b also have a high magnetic permeability.

Figure 24B:
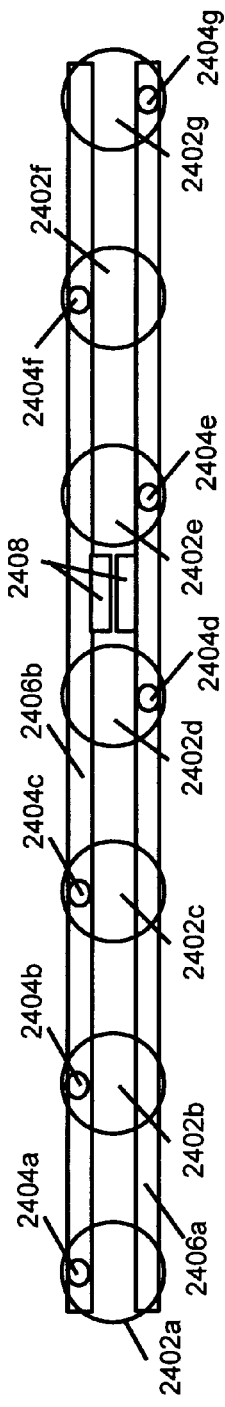

FIG. 24B depicts the connectivity of cores 2402a-2402g using connectors 2404a-2404g to conductor bars 2406a, 2406b in accordance with a code. The cores 2402a-2402g are with coils 1504a-1504g (not shown) that are oriented perpendicular to the direction of the movement of corresponding magnets (also not shown) as depicted in FIG. 24A. When the seven magnets 1508a-1508g align with coils 1504a-1504g, a spark arcs across points 2408 causing a normally closed switch 2110 to open such as is included in the system 2100 for producing an electric pulse provided in FIG. 21A.

FIG. 24C depicts a coil 1504 oriented parallel to the direction of movement of a magnet 1508. The coil 1504 is connected to other coils in accordance with a code. The coil 1504 surrounds a core 2402 having high magnetic permeability, for example iron. The core 2402 is connected by a connector 2404 to one or the other of two conductor bars 2406a, 2406b in accordance with the code. Under one arrangement, the connector 2404 and the two conductor bars 2406a, 2406b also have a high magnetic permeability.

Figure 24D:
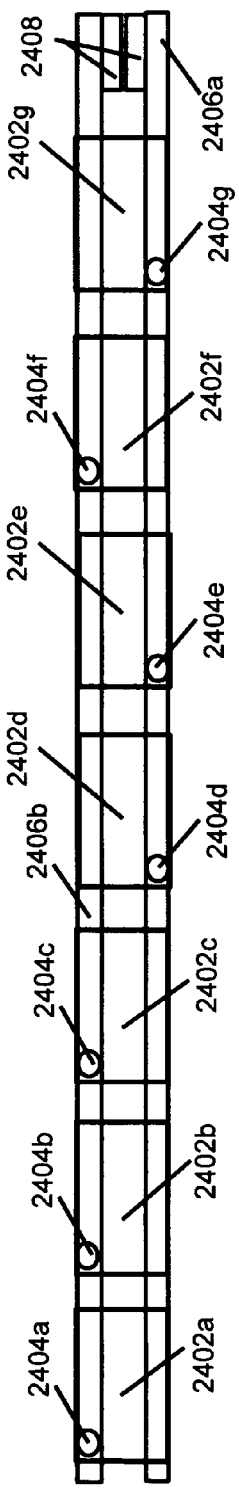

FIG. 24D depicts the connectivity of cores 2402a-2402g using connectors 2404a-2404g to conductor bars 2406a, 2406b in accordance with a code. The cores 2402a-2402g are with coils 1504a-1504g (not shown) that are oriented parallel to the direction of the movement of corresponding magnets (also not shown) as depicted in FIG. 24C. When the seven magnets 1508a-1508g align with coils 1504a-1504g, a spark arcs across points 2408 causing a normally closed switch 2110 to open such as is included in the system 2100 for producing an electric pulse provided in FIG. 21A.

Various techniques can be used to vary aspects of the correlated magneto of the present invention in order to advance or retard the timing of an engine. One approach is to move the correlation spike by re-coding the coils with switches, for example mechanical or high voltage semiconductor switches. This approach would provide two or more discrete points (in time) at which the high voltage could be produced depending on the switch positions. A number of conventional ways in which points are currently advanced or retarded in ignition coil-based systems, such as vacuum or centrifugal force, can be used to provide two or more positions at which the points open that correspond to the desired timing. Alternatively, the points could be made to close and open at all of the positions since a spark would only be produced when the correlation spike is present for a particular angle. Another approach would be to use a code that has multiple peaks where the points would open at a selected angle corresponding to one of the peaks. Still another approach is to use coding and magnet/coil spacing to produce a square pulse that is long enough to span the whole spark advance/retard range so that the points timing alone can be used to advance or retard timing. Under one arrangement, even spacing between magnets and between coils would be used. Under another arrangement, uneven spacing between magnets and between coils would be used, where the uneven spacing would take advantage of the monocycle waveform produced by the magnet/coil and act as a kind of filter, such as a Chebychev or the like. Since there are many ways to synthesize such filters it will be hard to exhaust all the variations. Some of the variables which can either be applied to the whole ensemble or on a per chip basis, are: spacing, magnet strength, core/magnet width (changes the monocycle wavelength) and transformer turns.

Figure 25:
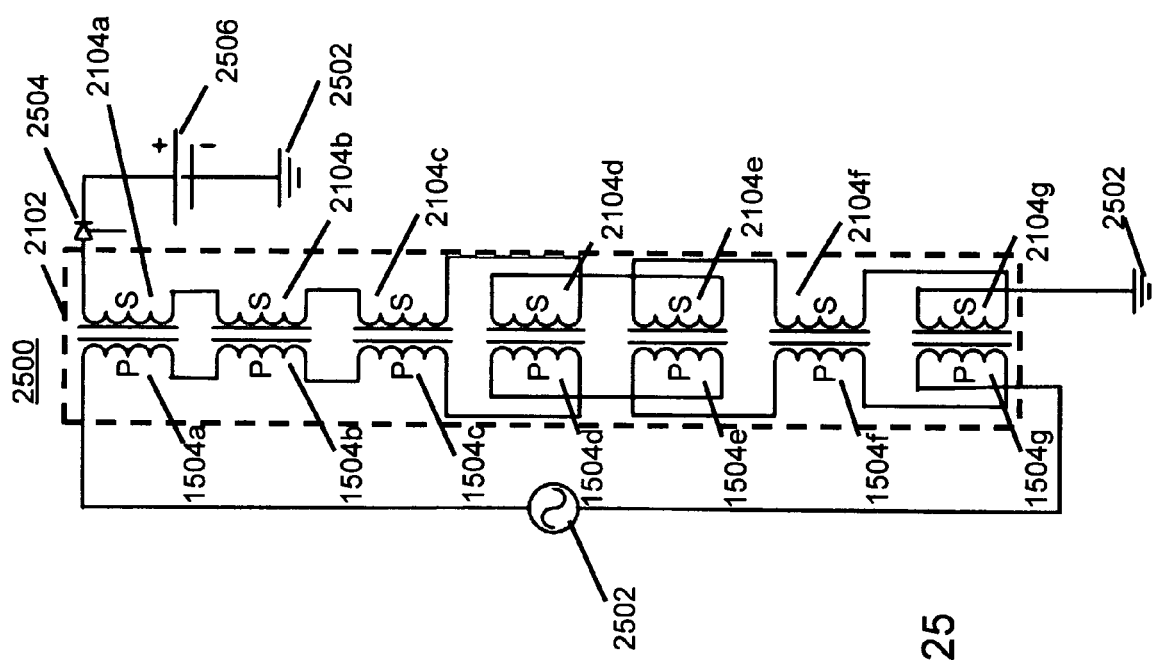
FIG. 25 depicts an exemplary correlated inductive battery charger circuit.

FIG. 25 depicts an exemplary correlated inductive battery charger circuit 2500 that includes a coil structure 2102 like that of FIG. 21A having seven primary coils 1504a-1504g and seven secondary coils 2104a-2104g that have positions and serial wiring (corresponding to a polarity of current directions) defined in accordance with a Barker-7 code. The primary coils 1504a-1504g are connected to an alternating current (AC) voltage source 2502, for example a 110-volt AC electrical outlet in a home. One end of connected secondary coils 2104a-2104g is connected to a ground 2502. The other end of the connected secondary coils 2104a-2104g is connected to a controlled rectifier 2504 that outputs to a battery 2506, which is also connected to a ground 2502.

Generally, various correlated inductance designs involving different types of magnetic field emission structures and corresponding coil structures can be implemented with myriad different object shapes to include the cylindrical, spherical, multi-level, and various other shapes described above and in patents incorporated by reference herein. Correlated inductance techniques can also be combined with correlated magnetic techniques. For example, correlated inductance can be used to control assembly of magnetic field emission structures to objects during assembly and to measure alignment accuracy of magnetic field emission structures relative to such objects.

While particular embodiments of the invention have been described, it will be understood, however, that the invention is not limited thereto, since modifications may be made by those skilled in the art, particularly in light of the foregoing teachings.

The invention claimed is:
1. An apparatus, comprising:
 a field emission source having polarities and positions in accordance with a code;
 a plurality of connected coils adapted to move proximate to said field emission source and having positions in accordance with said code; and
 wherein an electrical pulse is created when said field emission source is moved through alignment with said plurality of connected coils according to said code, wherein said coils are arranged according to an inphase-quadrature (I-Q) coil arrangement to produce a control system for controlling movement or to achieve alignment of said field emission source or said coil.
2. The apparatus of claim 1, wherein said apparatus is adapted to determine relative positions of two objects having associated with them said coil structure and said field emission source and wherein said relative positions of said two objects is determined by comparing a three-dimensional spatial electromotive force function to measurements of output voltages as said two objects move relative to each other.
3. The apparatus of claim 2, wherein said relative position measurements are used to vary movement of at least one of said two objects for guidance control purposes.

* * * * *